United States Patent
Jeong et al.

(10) Patent No.: US 11,025,226 B2
(45) Date of Patent: Jun. 1, 2021

(54) MULTIPLEXER

(71) Applicant: TAIYO YUDEN CO., LTD., Tokyo (JP)

(72) Inventors: Jaeho Jeong, Tokyo (JP); Masato Ito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/537,247

(22) Filed: Aug. 9, 2019

(65) Prior Publication Data
US 2020/0083864 A1 Mar. 12, 2020

(30) Foreign Application Priority Data

Sep. 7, 2018 (JP) .............................. JP2018-167561

(51) Int. Cl.
| | |
|---|---|
| *H03H 9/64* | (2006.01) |
| *H03H 9/72* | (2006.01) |
| *H03H 9/25* | (2006.01) |
| *H03H 9/145* | (2006.01) |

(52) U.S. Cl.
CPC .......... *H03H 9/6483* (2013.01); *H03H 9/145* (2013.01); *H03H 9/25* (2013.01); *H03H 9/72* (2013.01)

(58) Field of Classification Search
CPC ........ H03H 9/6483; H03H 9/145; H03H 9/25; H03H 9/72

USPC .......................................................... 333/133
See application file for complete search history.

(56) References Cited

U.S. PATENT DOCUMENTS

| | | | |
|---|---|---|---|
| 4,910,481 A | 3/1990 | Sasaki et al. | 333/134 |
| 6,031,435 A | 2/2000 | Inose et al. | 333/193 |
| 9,882,542 B2 | 1/2018 | Teramoto | |
| 2014/0113571 A1 | 4/2014 | Fujiwara et al. | 455/73 |
| 2015/0022257 A1 | 1/2015 | Iwaki | 327/382 |

FOREIGN PATENT DOCUMENTS

| | | |
|---|---|---|
| JP | 2014-120841 A | 6/2014 |
| JP | 2015-23411 A | 2/2015 |

*Primary Examiner* — Benny T Lee
*Assistant Examiner* — Hafizur Rahman
(74) *Attorney, Agent, or Firm* — Stein IP, LLC

(57) ABSTRACT

A multiplexer includes: a first bandpass filter having a first end coupled to a common terminal and a second end coupled to a first terminal, the first bandpass filter having a first passband; a second bandpass filter having a first end coupled to the common terminal and a second end coupled to a second terminal, the second bandpass filter having a second passband that does not overlap with the first passband and is higher than the first passband; and a first band-stop filter having a first end coupled to the first terminal and a second end coupled to the second terminal, the first band-stop filter having a first stopband formed of a first attenuation pole and a second attenuation pole, the first attenuation pole being located within the first passband or near the first passband, the second attenuation pole being located within the second passband or near the second passband.

20 Claims, 23 Drawing Sheets

MULTIPLEXER

CROSS-REFERENCE TO RELATED APPLICATION

This application is based upon and claims the benefit of priority of the prior Japanese Patent Application No. 2018-167561, filed on Sep. 7, 2018, the entire contents of which are incorporated herein by reference.

FIELD

A certain aspect of the present invention relates to a multiplexer.

BACKGROUND

It has been known to provide an additional circuit to a multiplexer having a plurality of filters to improve the isolation characteristics between terminals as disclosed in, for example, Japanese Patent Application Publication Nos. 2014-120841 and 2015-23411 (hereinafter, referred to as Patent Documents 1 and 2, respectively).

SUMMARY

According to an aspect of the present invention, there is provided a multiplexer including: a first bandpass filter having a first end coupled to a common terminal and a second end coupled to a first terminal, the first bandpass filter having a first passband; a second bandpass filter having a first end coupled to the common terminal and a second end coupled to a second terminal, the second bandpass filter having a second passband that does not overlap with the first passband and is higher than the first passband; and a first band-stop filter having a first end coupled to the first terminal and a second end coupled to the second terminal, the first band-stop filter having a first stopband formed of a first attenuation pole and a second attenuation pole, the first attenuation pole being located within the first passband or near the first passband, the second attenuation pole being located within the second passband or near the second passband.

DETAILED DESCRIPTION

In the multiplexers disclosed in Patent Documents 1 and 2, it is difficult to improve the isolation characteristics in the wide band.

Hereinafter, embodiments will be described with reference to the accompanying drawings.

First Embodiment

Figure 1:
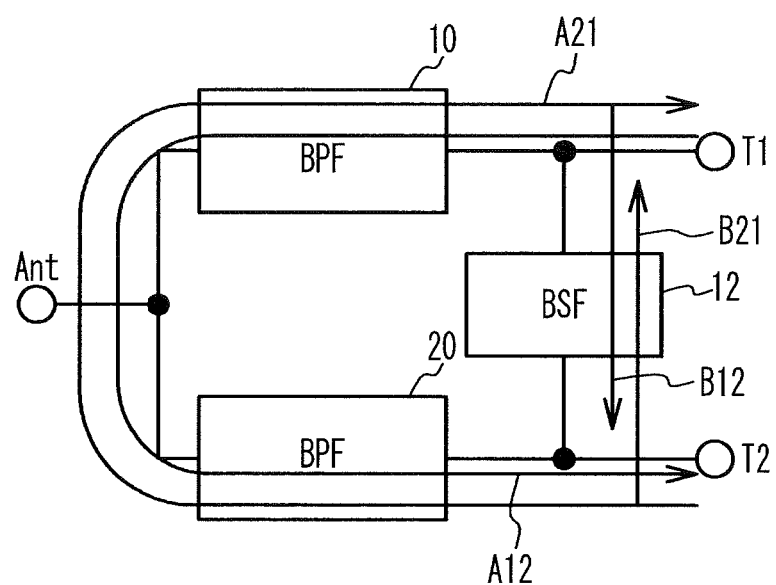
FIG. 1 is a circuit diagram of a multiplexer in accordance with a first embodiment.

FIG. 1 is a circuit diagram of a multiplexer in accordance with a first embodiment. As illustrated in FIG. 1, a bandpass filter (BPF) 10 is connected between a common terminal Ant and a terminal T1. A BPF 20 is connected between the common terminal Ant and a terminal T2. A band-stop filter (BSF) 12 is connected between the terminal T1 and the terminal T2.

The BPF 10 allows signals in a passband PB1 to pass therethrough among high-frequency signals passing between the common terminal Ant and the terminal T1, and suppresses signals in other frequency bands. The BPF 20 allows signals in a passband PB2 to pass therethrough among high-frequency signals passing between the common terminal Ant and the terminal T2, and suppresses signals in other frequency bands. Since the passbands PB1 and PB2 do not overlap, it is preferable that signals in the passbands PB1 and PB2 input to the terminal T1 are not output from the terminal T2. However, a signal A12, which is a part of a signal in the passband PB2 input to the terminal T1, leaks to the terminal T2. A signal A21, which is a part of a signal in the passband PB1 input to the terminal T2, leaks to the terminal T1. Thus, the isolation characteristic between the terminals T1 and T2 deteriorates.

The BSF 12 transmits a signal B12, which is a part of a signal in the passband PB2 input to the terminal T1, to the terminal T2 to couple the signal B12 with the signal A12. The BSF 12 transmits a signal B21, which is a part of a signal in the passband PB1 input to the terminal T2, to the terminal T1 to couple the signal B21 with the signal A21. The BSF 12 causes the signals A12 and B12 to have approximately the same amplitude and substantially opposite phases in the passband PB2. Accordingly, the signals A12 and B12 cancel each other out, and thereby, the isolation characteristic from the terminal T1 to the terminal T2 improves. The BSF 12 causes the signals A21 and B21 to have approximately the same amplitude and substantially opposite phases in the passband PB1. Accordingly, the signals A21 and B21 cancel each other out, and thereby, the isolation characteristic from the terminal T2 to the terminal T1 improves. When the signals A12 and B12 have substantially opposite phases and the signals A21 and B21 have substantially opposite phases, the phase difference between the signals A12 and B12 and the phase difference between the signals A21 and B21 are within a range from −180° to 180°, and the absolute values of the phase differences are greater than 90°.

Figure 2A:
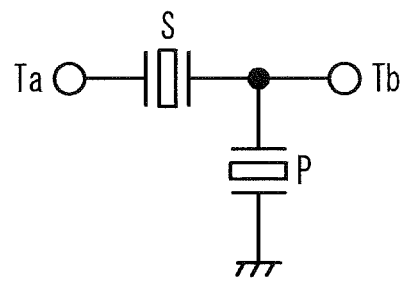
FIG. 2A through FIG. 2C are circuit diagrams illustrating exemplary BSFs in the first embodiment.
Figure 2B:
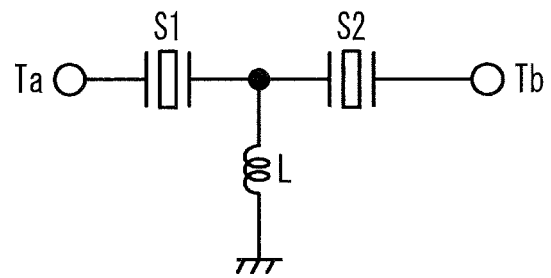
Figure 2C:
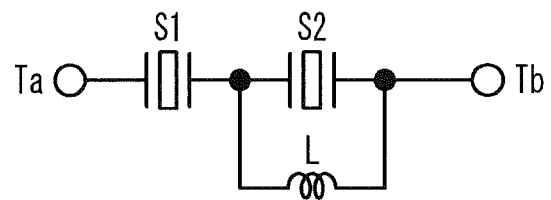

FIG. 2A through FIG. 2C are circuit diagrams of exemplary BSFs in the first embodiment. As illustrated in FIG. 2A, a series resonator S is connected in series between terminals Ta and Tb, and a parallel resonator P is connected in parallel between the terminals Ta and Tb. As illustrated in FIG. 2B, series resonators S1 and S2 are connected in series between the terminals Ta and Tb, and an inductor L is connected between a node between the series resonators S1 and S2 and a ground. As illustrated in FIG. 2C, the series resonators S1 and S2 are connected in series between the terminals Ta and Tb, and the inductor L is connected in parallel to the series resonator S2. As illustrated in FIG. 2A through FIG. 2C, the circuit configuration of the BSF can be freely determined.

Figure 3A:
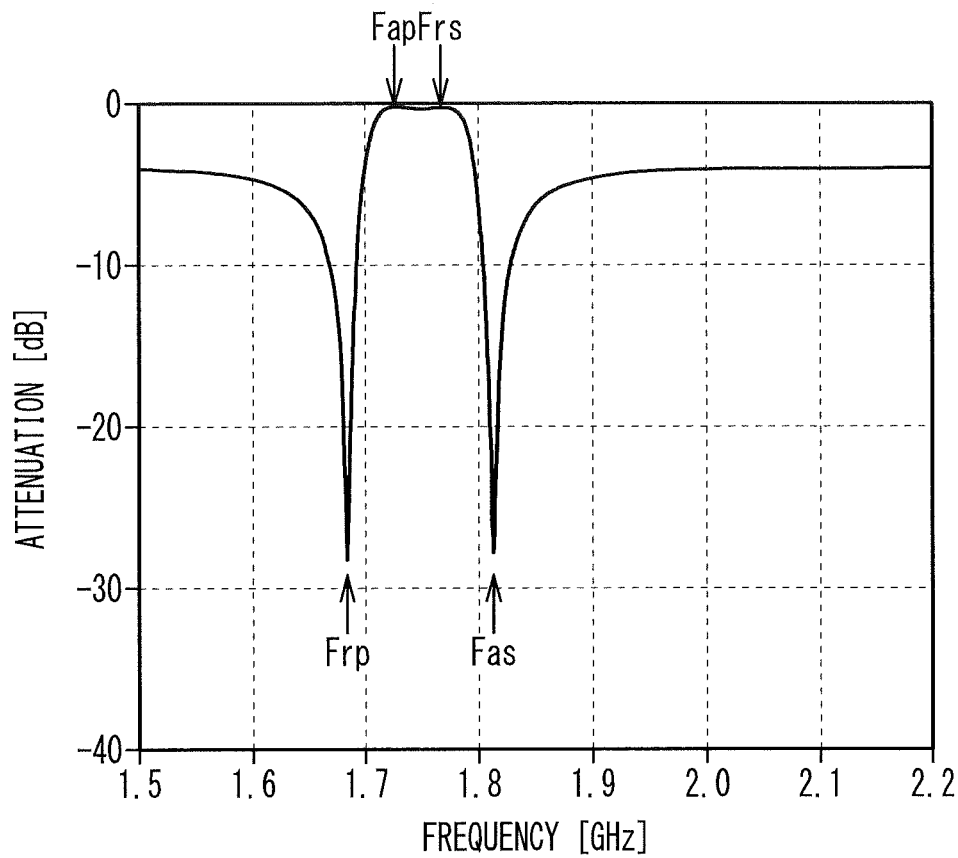
FIG. 3A illustrates the transmission characteristic of a BPF.
Figure 3B:
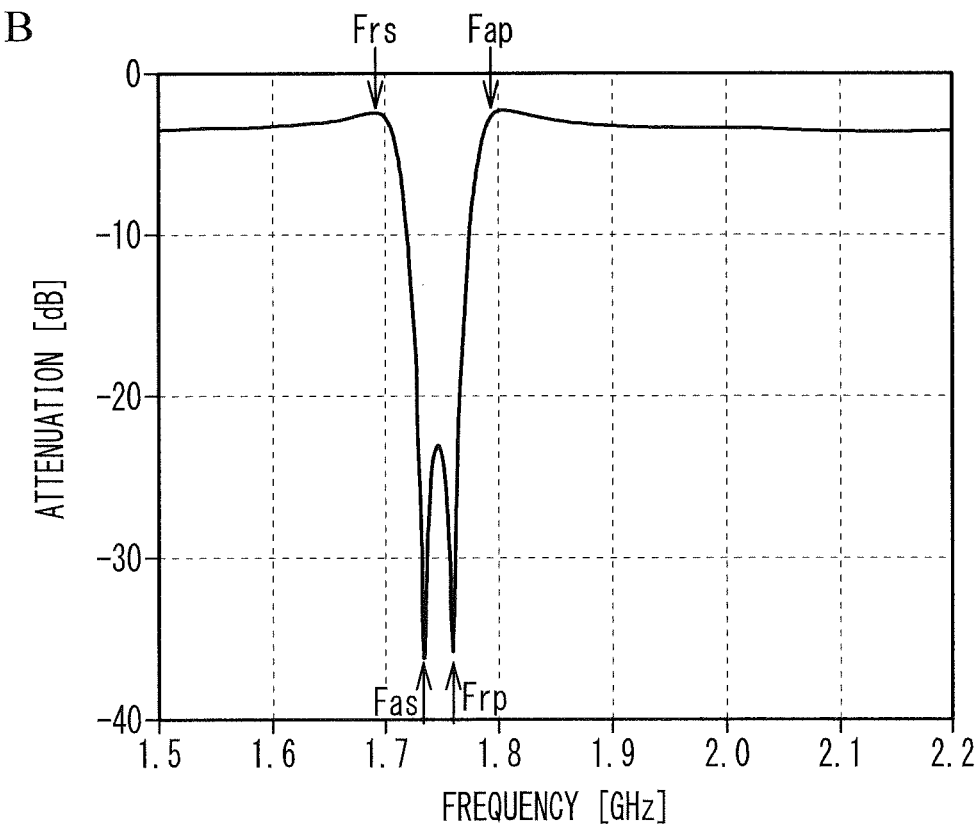
FIG. 3B illustrates the transmission characteristic of the BSF.

FIG. 3A illustrates the transmission characteristic of the BPF, and FIG. 3B illustrates the transmission characteristic of the BSF. As illustrated in FIG. 3A, in the circuit illustrated in FIG. 2A, the antiresonant frequency Fas of the series resonator S is made higher than the resonant frequency Frp of the parallel resonator P. The resonant frequency Frs of the series resonator S and the antiresonant frequency Fap of the parallel resonator P are made approximately equal to each other. In this configuration, Frs and Fap form the passband, and Frp and Fas form stopbands. Thus, a bandpass filter is formed.

As illustrated in FIG. 3B, in the circuit illustrated in FIG. 2A, the antiresonant frequency Fas of the series resonator S is made lower than the resonant frequency Frp of the parallel resonator P. In this configuration, Fas and Frp form a stopband, and Frs and Fap form passbands. Thus, a band-stop filter is formed. The band-stop filter is also called a band elimination filter. When the stopband is narrow, the band-stop filter is also called a notch filter.

Figure 4A:
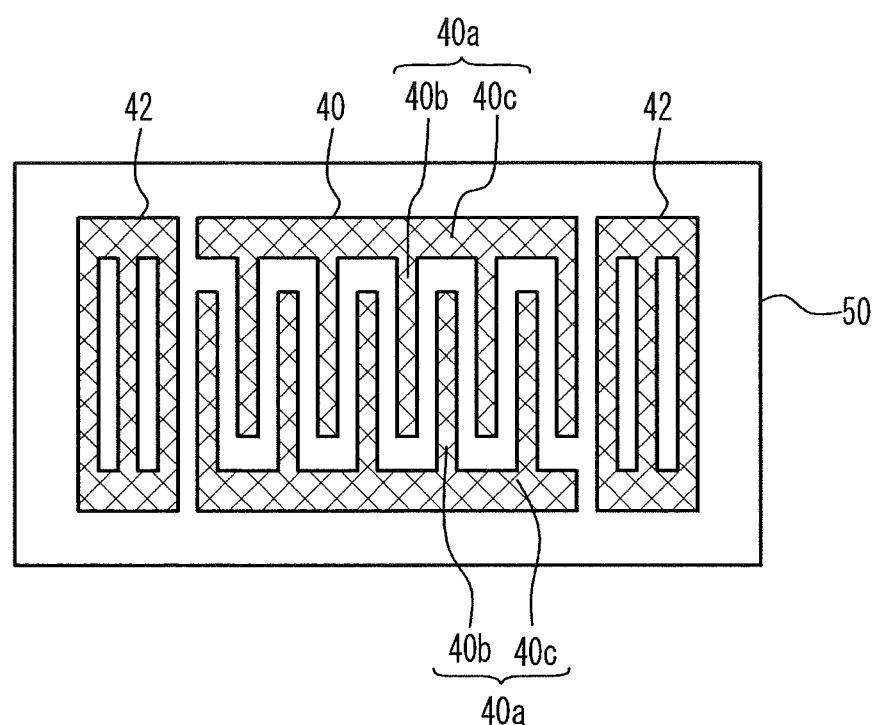
FIG. 4A and FIG. 4B are cross-sectional views illustrating exemplary acoustic wave resonators in the first embodiment.
Figure 4B:
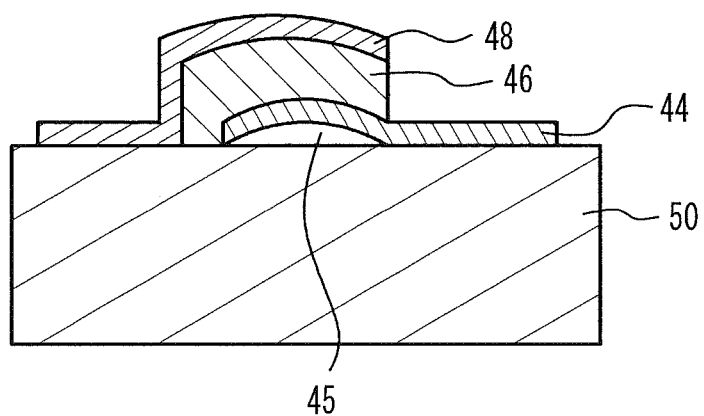

FIG. 4A and FIG. 4B are cross-sectional views of acoustic wave resonators in the first embodiment. FIG. 4A illustrates a case where the acoustic wave resonator is a surface acoustic wave resonator. An interdigital transducer (IDT) 40 and reflectors 42 are formed on a substrate 50. The IDT 40 includes a pair of comb-shaped electrodes 40a facing each other. The comb-shaped electrode 40a includes a plurality of electrode fingers 40b and a bus bar 40c connecting the electrode fingers 40b. The reflectors 42 are located at both sides of the IDT 40. The IDT 40 excites a surface acoustic wave on the substrate 50. The substrate 50 is a piezoelectric substrate such as, but not limited to, a lithium tantalate substrate or a lithium niobate substrate. The substrate 50 may be a composite substrate having a structure in which a piezoelectric substrate is bonded with a support substrate. The support substrate is, for example, a sapphire substrate, a spinel substrate, an alumina substrate, a crystal substrate, or a silicon substrate. The IDT 40 and the reflectors 42 are formed of, for example, an aluminum film or a copper film. A protective film or a temperature compensation film may be provided on the substrate 50 so as to cover the IDT 40 and the reflectors 42.

FIG. 4B illustrates a case where the acoustic wave resonator in the first embodiment is a piezoelectric thin film resonator. A piezoelectric film 46 is located on the substrate 50. A lower electrode 44 and an upper electrode 48 are located so as to sandwich the piezoelectric film 46. An air gap 45 is formed between the lower electrode 44 and the substrate 50. The region where the lower electrode 44 and the upper electrode 48 face each other across at least a part of the piezoelectric film 46 is a resonance region. The lower electrode 44 and the upper electrode 48 in the resonance region excites an acoustic wave in the thickness extension mode in the piezoelectric film 46. The substrate 50 is, for example, a sapphire substrate, a spinel substrate, an alumina substrate, a glass substrate, a crystal substrate, or a silicon substrate. The lower electrode 44 and the upper electrode 48 are formed of a metal film such as, but not limited to, a ruthenium film. The piezoelectric film 46 is, for example, an aluminum nitride film.

Simulation 1

Figure 5:
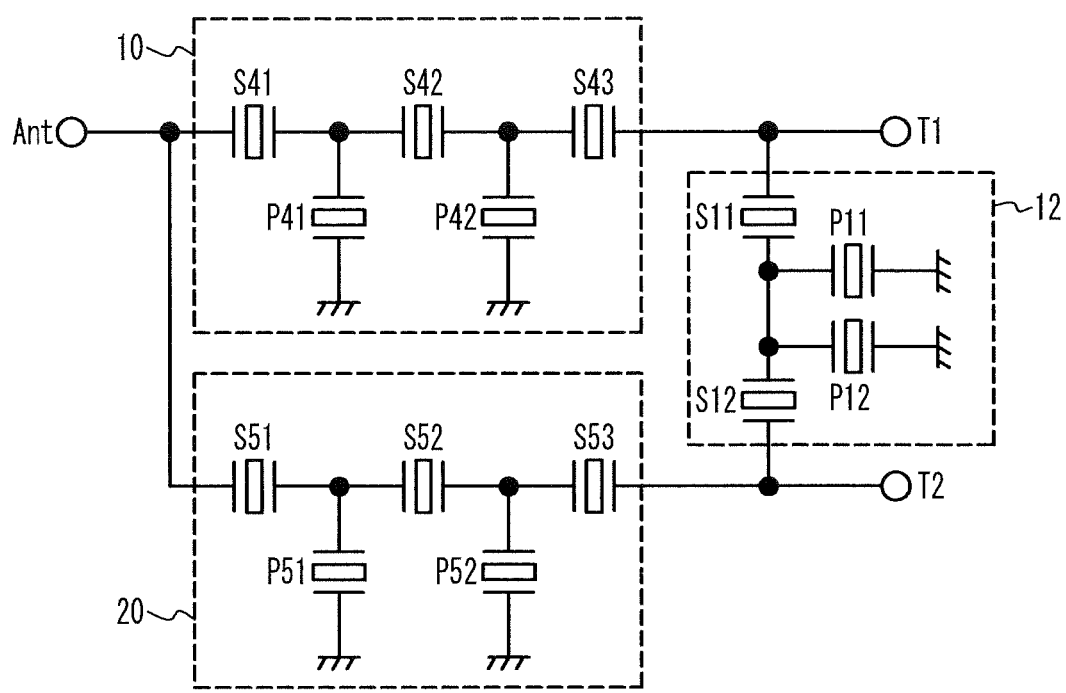
FIG. 5 is a circuit diagram of a multiplexer in simulation 1.

The characteristics of the multiplexer of the first embodiment were simulated. FIG. 5 is a circuit diagram of a multiplexer in simulation 1. In the BPF 10, series resonators S41 through S43 are connected in series between the common terminal Ant and the terminal T1, and parallel resonators P41 and P42 are connected in parallel between the common terminal Ant and the terminal T1. In the BPF 20, series resonators S51 through S53 are connected in series between the common terminal Ant and the terminal T2, and parallel resonators P51 and P52 are connected in parallel between the common terminal Ant and the terminal T2. In the BSF 12, series resonators S11 and S12 are connected in series between the terminals T1 and T2, and parallel resonators P11 and P12 are connected in parallel between a node between the series resonators S11 and S12 and a ground.

Simulated were the isolation characteristics from the terminal T1 to the terminal T2 of a multiplexer A with the BSF 12, which corresponds to the first embodiment, a multiplexer B without the BSF 12, which corresponds to a first comparative example, and the BSF 12 alone. The magnitude of the isolation of the multiplexer B corresponds to the amplitudes of the signals A12 and A21 in FIG. 1. The magnitude of the isolation of the BSF 12 corresponds to the amplitudes of the signals B12 and B21 in FIG. 1.

In the BPF 10, the resonant frequency of each resonator was set so that the passband PB1 was from 1535 MHz to 1555 MHz. In the BPF 20, the resonant frequency of each resonator was set so that the passband PB2 was from 1651 MHz to 1671 MHz. The antiresonant frequencies of the series resonators S11 and S12 are respectively represented by Fas1 and Fas2, and the resonant frequencies of the parallel resonators P11 and P12 are respectively represented by Frp1 and Frp2.

Figure 6:
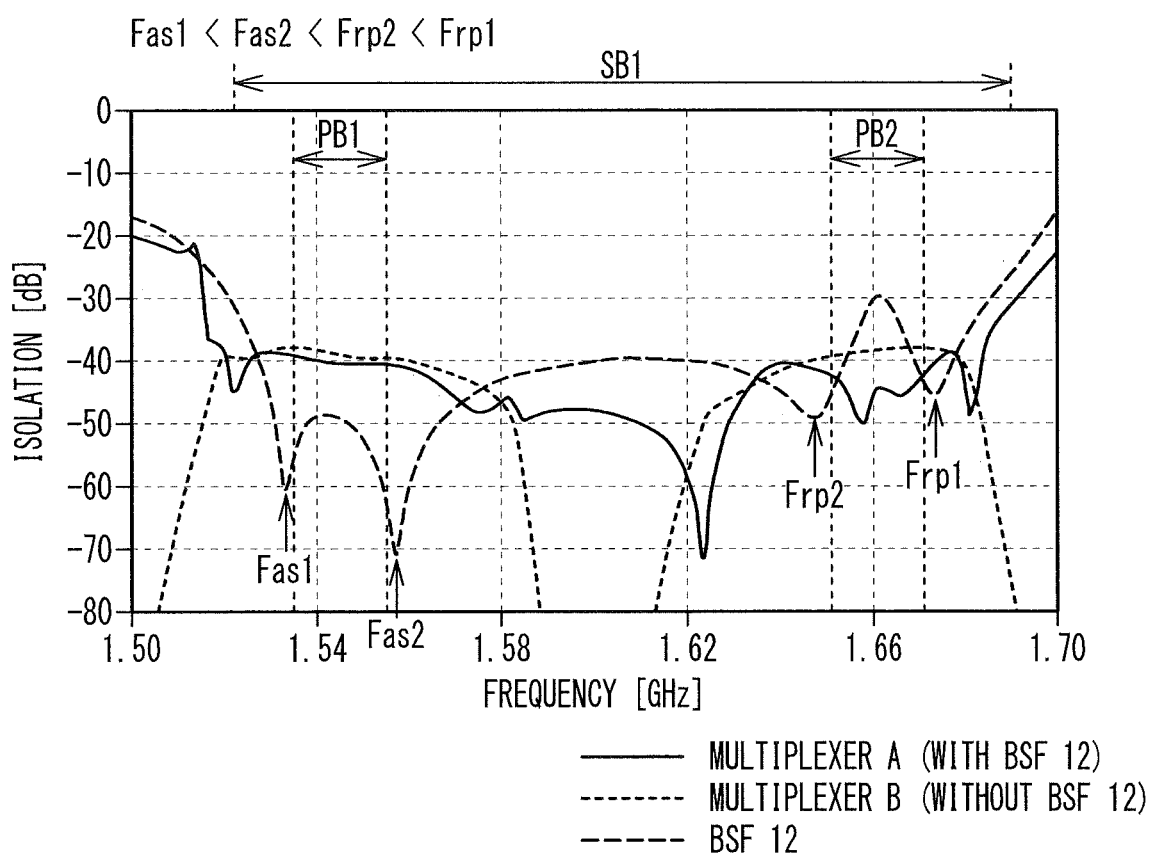
FIG. 6 illustrates isolation characteristics in simulation 1.

FIG. 6 illustrates isolation characteristics in simulation 1. As illustrated in FIG. 6, the antiresonant frequency Fas1 of the series resonator S11 is located near the passband PB1 of the BPF 10, and is lower than the passband PB1. The antiresonant frequency Fas2 of the series resonator S12 is located near the passband PB1 of the BPF 10, and is higher than the passband PB1. The resonant frequency Frp1 of the parallel resonator P11 is located near the passband PB2 of the BPF 20, and is higher than the passband PB2. The resonant frequency Frp2 of the parallel resonator P12 is located near the passband PB2 of the BPF 20, and is lower than the passband PB2. Fas1, Fas2, Frp1, and Frp2 form a stopband SB1, which includes the passbands PB1 and PB2, of the BSF 12.

In the passbands PB1 and PB2, the difference in the magnitude of the isolation between the multiplexer B and the BSF 12 (i.e., the difference in amplitude between the signals A12 and B12 in FIG. 1 and the difference in amplitude between the signals A21 and B21 in FIG. 1) is approximately ±10 dB. The passband PB1 is located within the stopband of the BPF 20, and the passband PB2 is located within the stopband of the BPF 10. Thus, by configuring the passbands PB1 and PB2 to be included in the stopband SB1 of the BSF 12, the amplitudes of the signals A12 and A21 passing through the multiplexer B can be made to be substantially the same as the amplitudes of the signals B12 and B21 passing through the BSF 12, respectively.

Figure 7A:
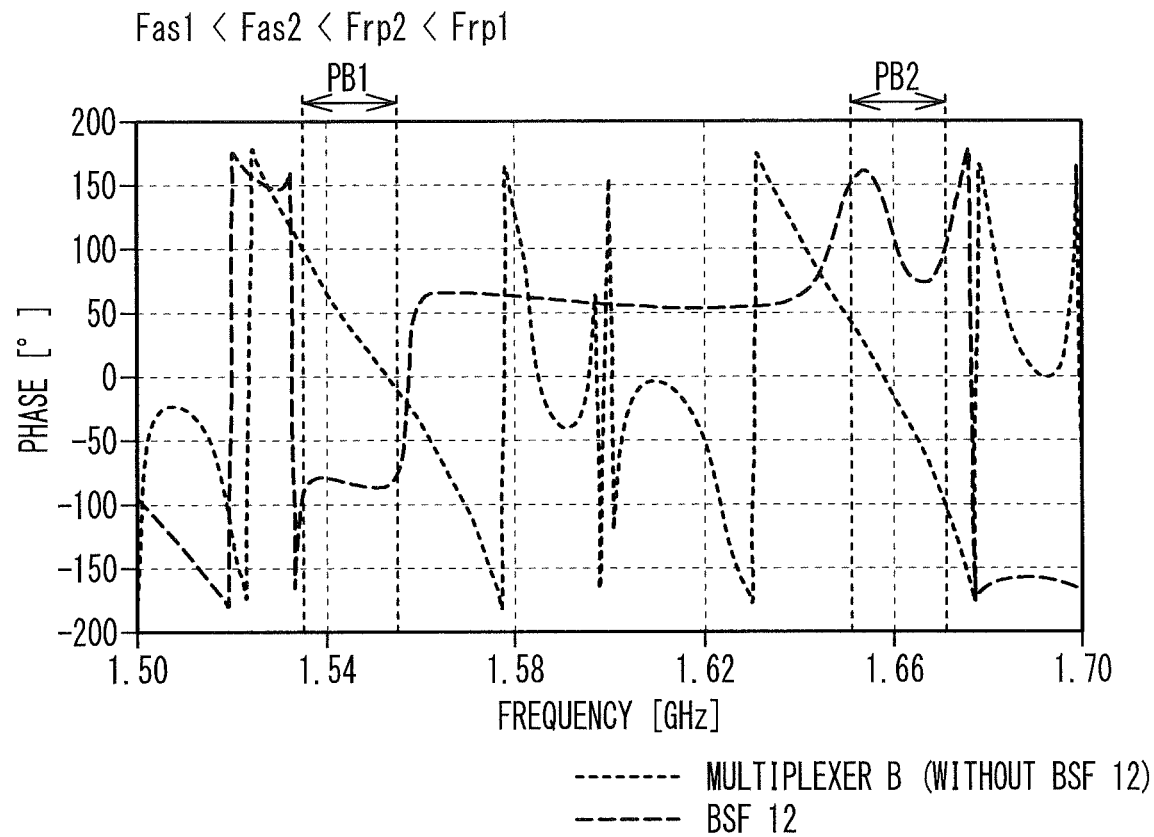
FIG. 7A illustrates phases in simulation 1.
Figure 7B:
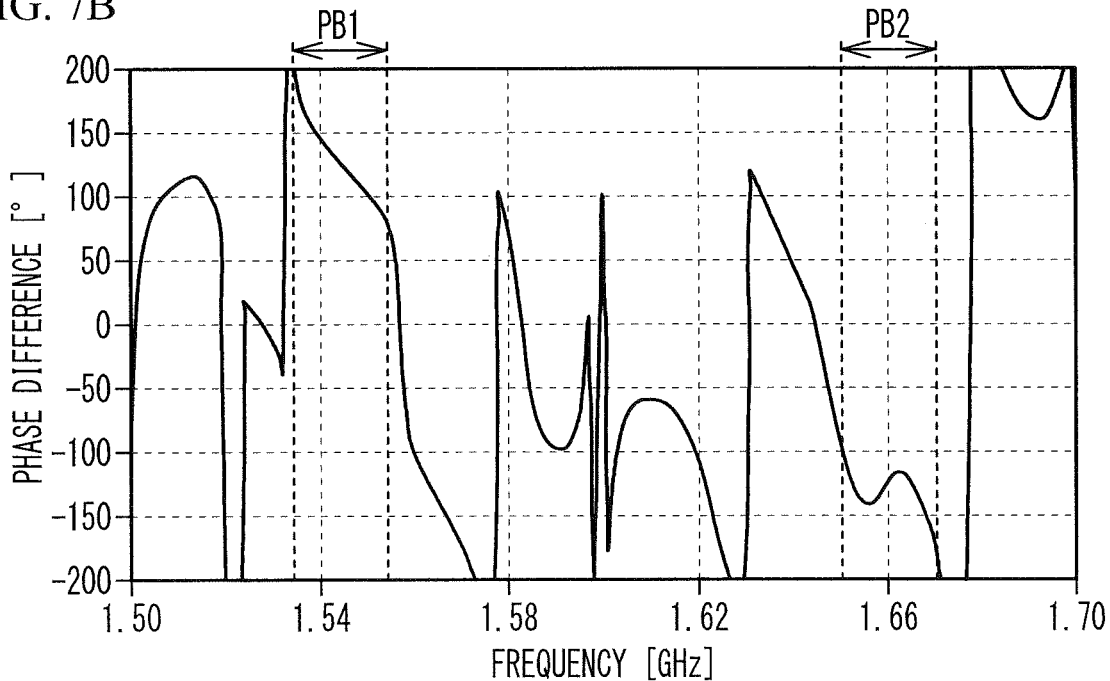
FIG. 7B illustrates a phase difference in simulation 1.

FIG. 7A illustrates phases in simulation 1, and FIG. 7B illustrates a phase difference in simulation 1. FIG. 7A illustrates the phase at the terminal T2 with respect to the terminal T1 in each of the multiplexer B without the BSF 12 and the BSF 12. FIG. 7B illustrates the phase difference between the multiplexer B without the BSF 12 and the BSF 12 alone.

As illustrated in FIG. 7A, in the passband PB1, the phase of the multiplexer B is from 100° to 0°, and the phase of the BSF 12 is −80°. In the passband PB2, the phase of the multiplexer B is from 50° to −100°, and the phase of the BSF 12 is from 150° to 80°. As illustrated in FIG. 7B, the phase difference between the multiplexer B and the BSF 12 in the passband PB1 is from 180° to 90°. The phase difference between the multiplexer B and the BSF 12 in the passband PB2 is from −110° to −180°.

As described above, the signal A12 passing through the multiplexer B and the signal B12 passing through the BSF 12 have approximately the same amplitude, and have substantially opposite phases, and the signal A21 passing through the multiplexer B and the signal B21 passing through the BSF 12 have approximately the same amplitude, and have substantially opposite phases. Accordingly, as illustrated in FIG. 6, in the passbands PB1 and PB2, the isolation characteristic of the multiplexer A is better than that of the multiplexer B.

Simulated was whether the magnitude relationship between the antiresonant frequencies Fas1 and Fas2 of the series resonators S11 and S12 and the magnitude relationship between the resonant frequencies Frp1 and Frp2 of the parallel resonators P11 and P12 affect the isolation characteristics.

Figure 8A:
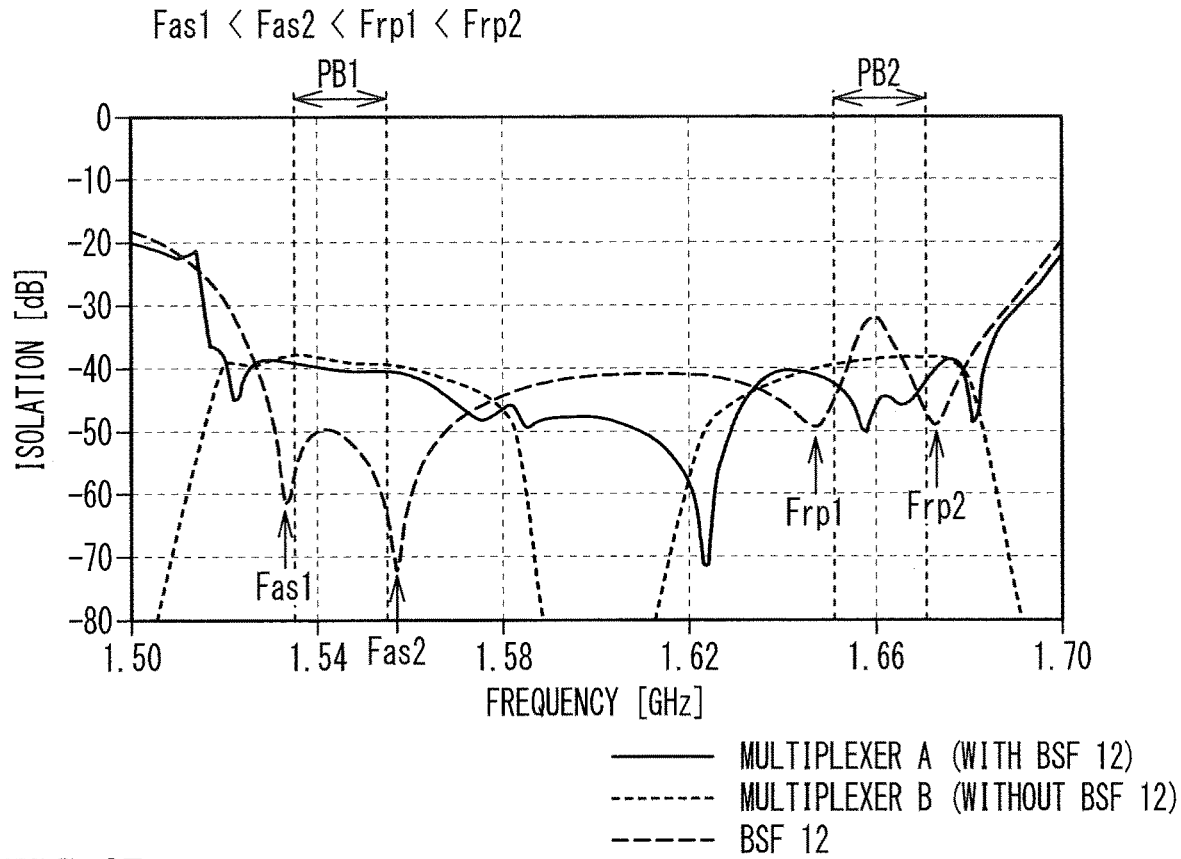
FIG. 8A illustrates isolation characteristics in simulation 1.
Figure 8B:
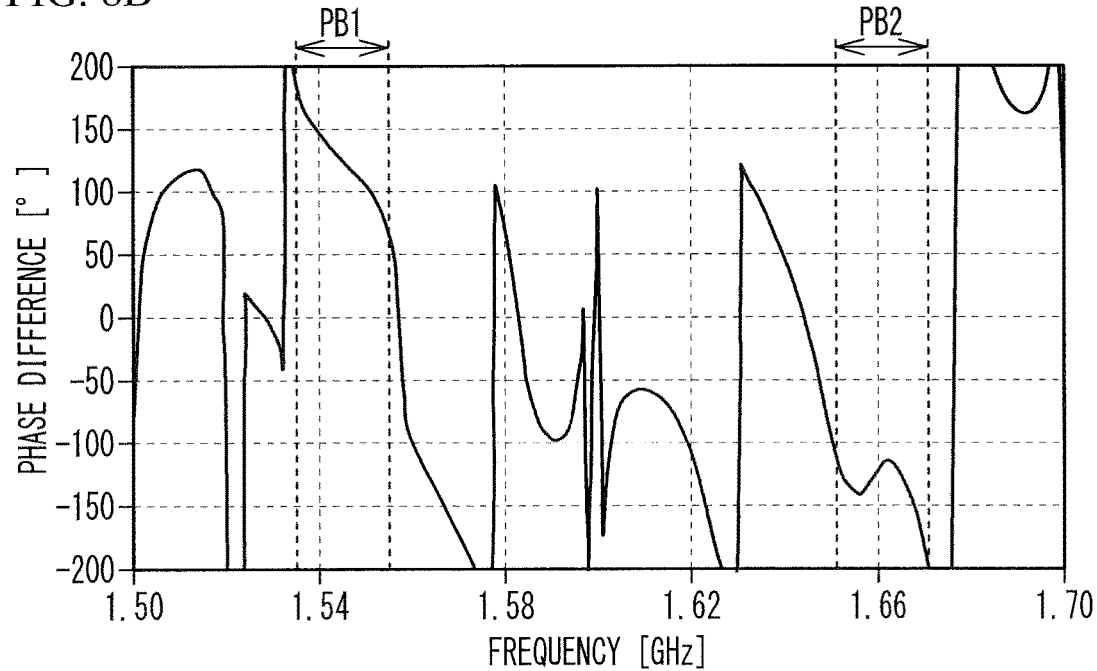
FIG. 8B illustrates a phase difference in simulation 1.

FIG. 8A illustrates isolation characteristics in simulation 1, and FIG. 8B illustrates a phase difference in simulation 1. As illustrated in FIG. 8A, it was assumed that Fas1<Fas2 and Frp1<Frp2.

Figure 9A:
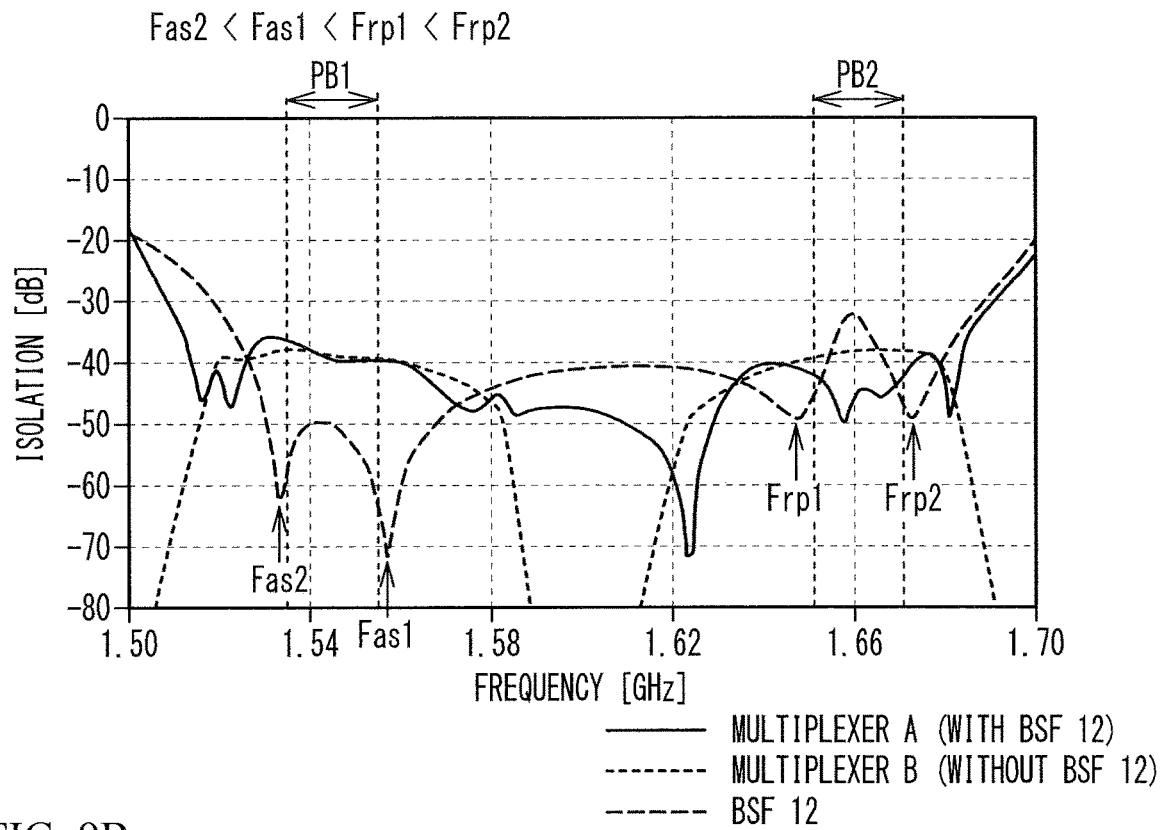
FIG. 9A illustrates isolation characteristics in simulation 1.
Figure 9B:
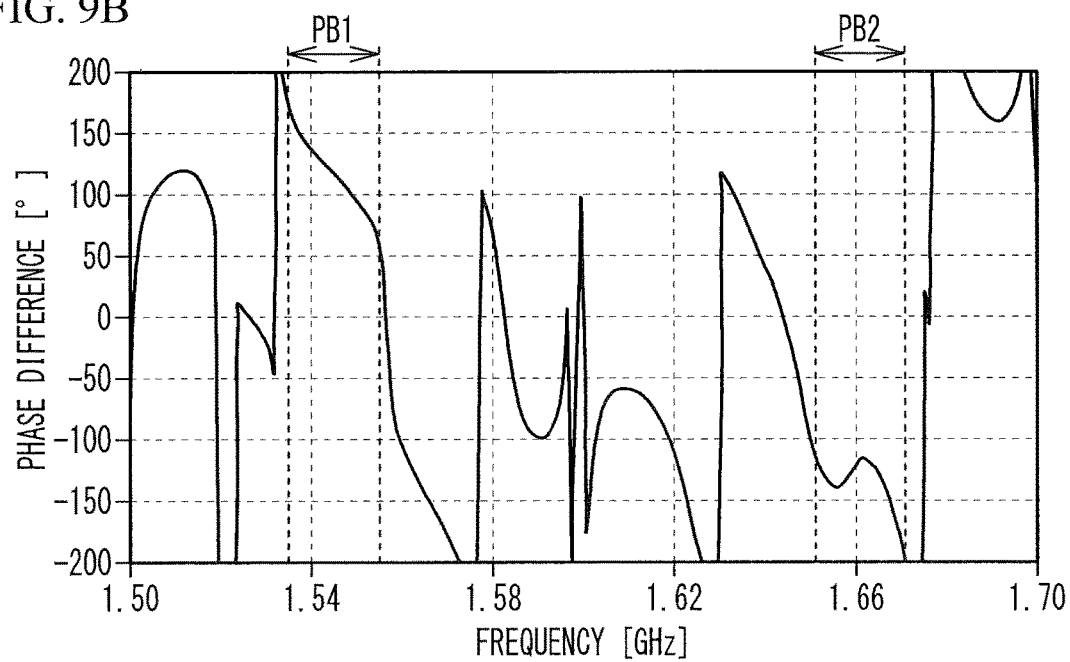
FIG. 9B illustrates a phase difference in simulation 1.

FIG. 9A illustrates isolation characteristics in simulation 1, and FIG. 9B illustrates a phase difference in simulation 1. As illustrated in FIG. 9A, it was assumed that Fas2<Fas1 and Frp1<Frp2.

Figure 10A:
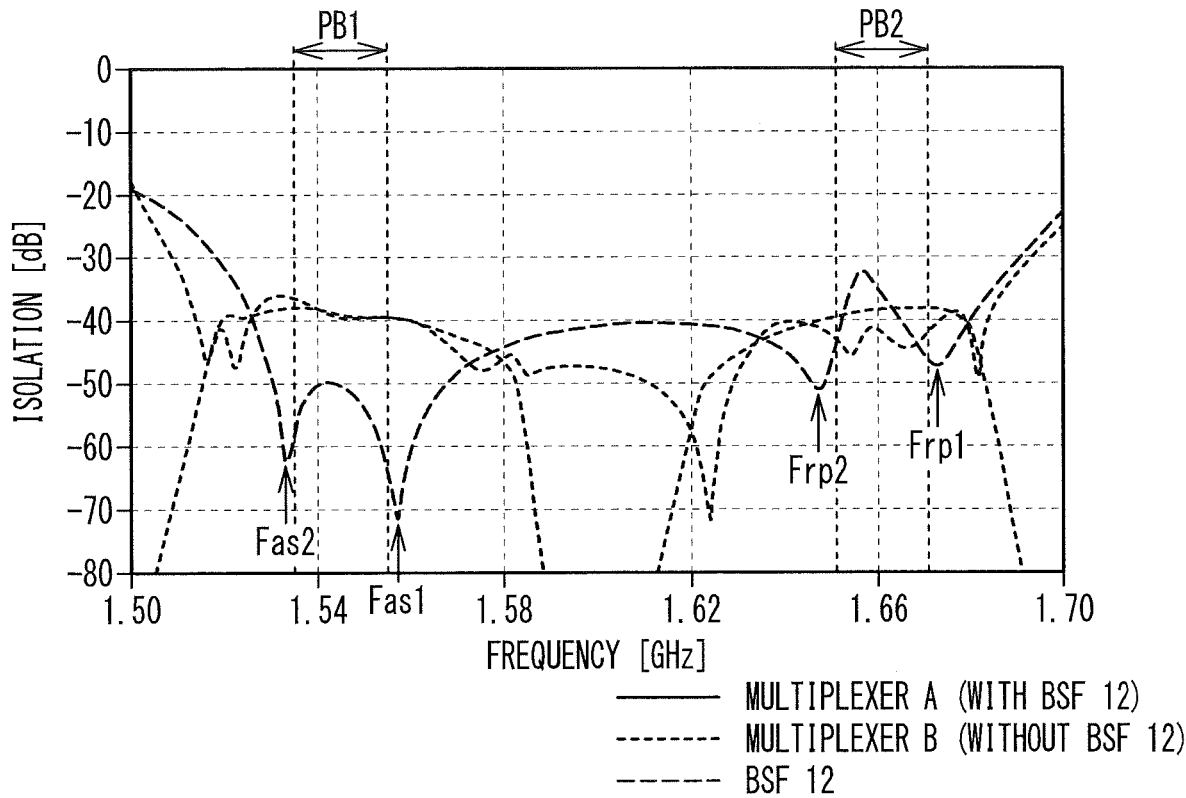
FIG. 10A illustrates isolation characteristics in simulation 1.
Figure 10B:
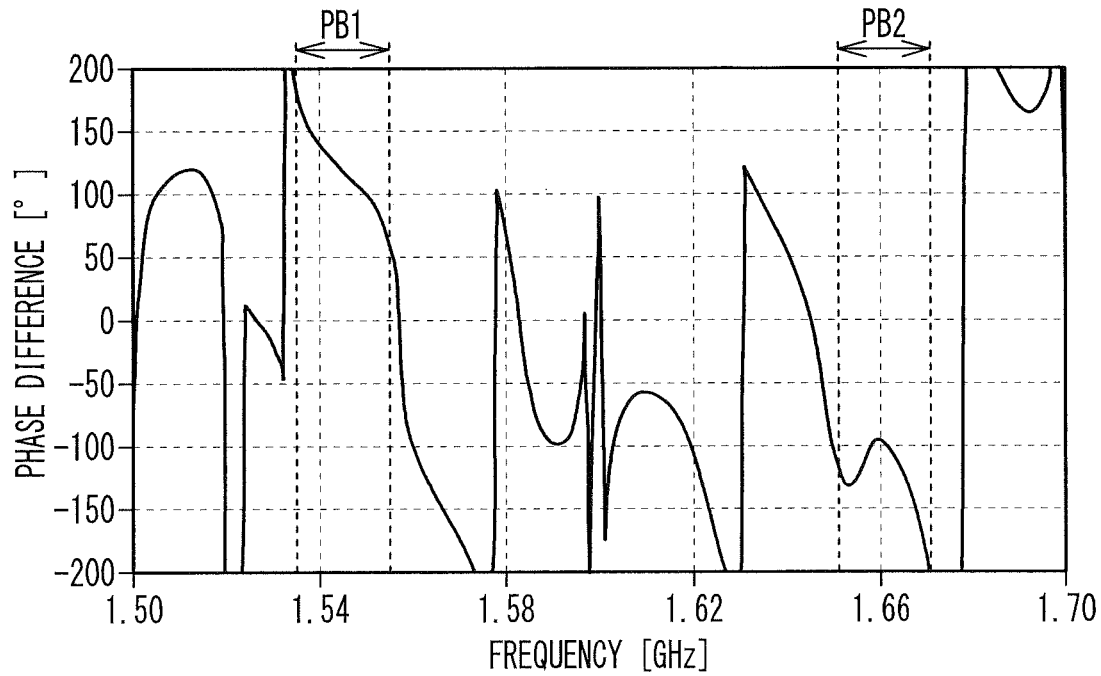
FIG. 10B illustrates a phase difference in simulation 1.

FIG. 10A illustrates isolation characteristics in simulation 1, and FIG. 10B illustrates a phase difference in simulation 1. As illustrated in FIG. 10A, it was assumed that Fas2<Fas1 and Frp2<Frp1.

As illustrated in FIG. 6 through FIG. 10B, even when the magnitude relationship between Fas1 and Fas2 is reversed, and even when the magnitude relationship between Frp1 and Frp2 is reversed, the amplitude of the signal passing through the BSF 12 hardly changes. The phase difference between the multiplexer B and the BSF 12 also hardly changes. Thus, the isolation characteristic of the multiplexer A hardly changes. As seen above, the connecting order of the series resonators S11 and S12 and the connecting order of the parallel resonators P11 and P12 can be freely selected.

First Variation of the First Embodiment

Figure 11B:
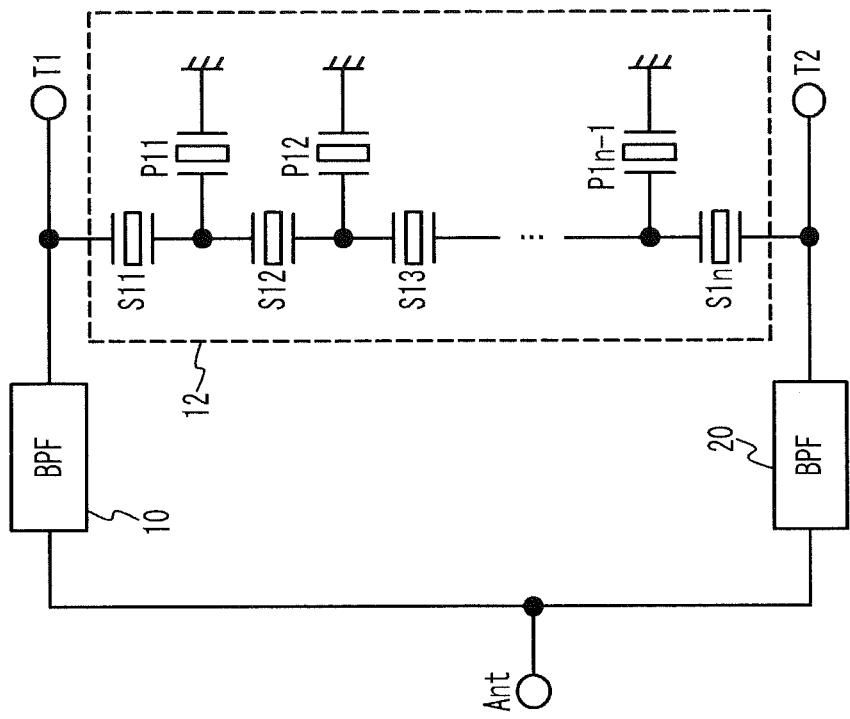
FIG. 11A and FIG. 11B are circuit diagrams of multiplexers in accordance with first and second variations of the first embodiment.
Figure 11A:
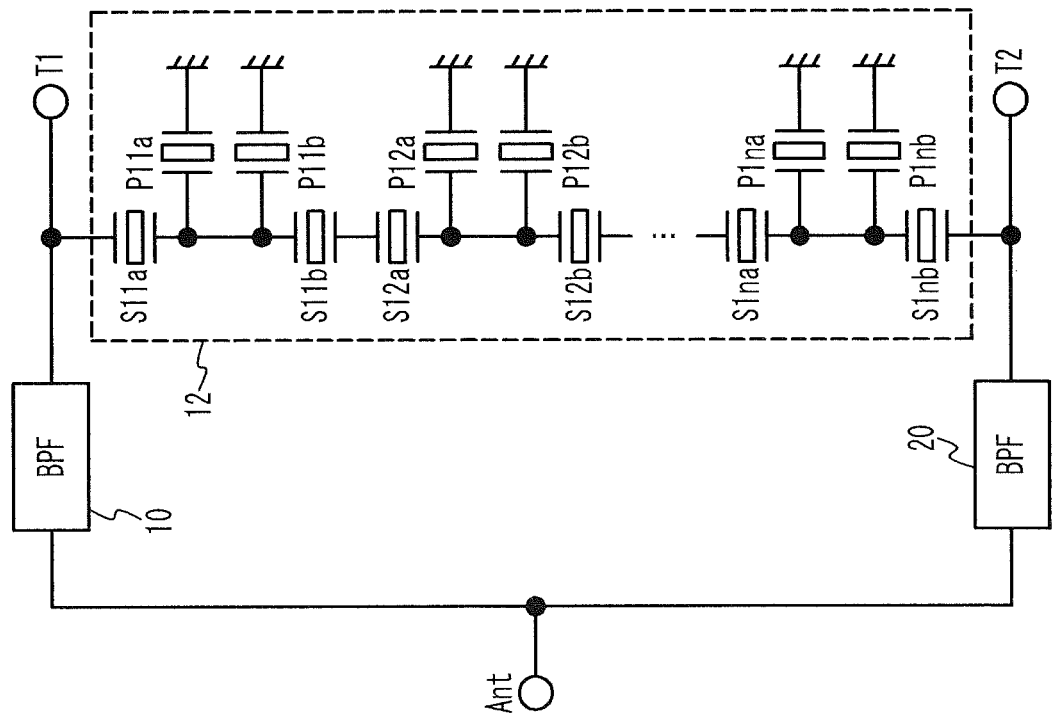

FIG. 11A is a circuit diagram of a multiplexer in accordance with a first variation of the first embodiment. As illustrated in FIG. 11A, in the BSF 12, parallel resonators P11a and P11b are connected between series resonators S11a and S11b. Parallel resonators P12a and P12b are connected between series resonators S12a and S12b. Similarly, parallel resonators P1na and P1nb are connected between series resonators S1na and S1nb. The BSF 12 is a 2n-stage ladder-type filter where S11a and P11a form one stage.

Second Variation of the First Embodiment

FIG. 11B is a circuit diagram of a multiplexer in accordance with a second variation of the first embodiment. As illustrated in FIG. 11B, in the BSF 12, each of parallel resonators P11 through P1n-1 is connected between the corresponding two of the series resonators S11 through S1n. The parallel resonator P11 corresponds to a resonator obtained by combining the parallel resonators P11a and P11b of the first variation of the first embodiment. The series resonator S12 corresponds to a resonator obtained by combining the series resonators S11b and S12a of the first variation of the first embodiment.

As in the first and second variations of the first embodiment, the number of series resonators, the connection of the series resonators, the number of parallel resonators, and the connection of the parallel resonators can be freely selected.

Second Embodiment

Figure 12:
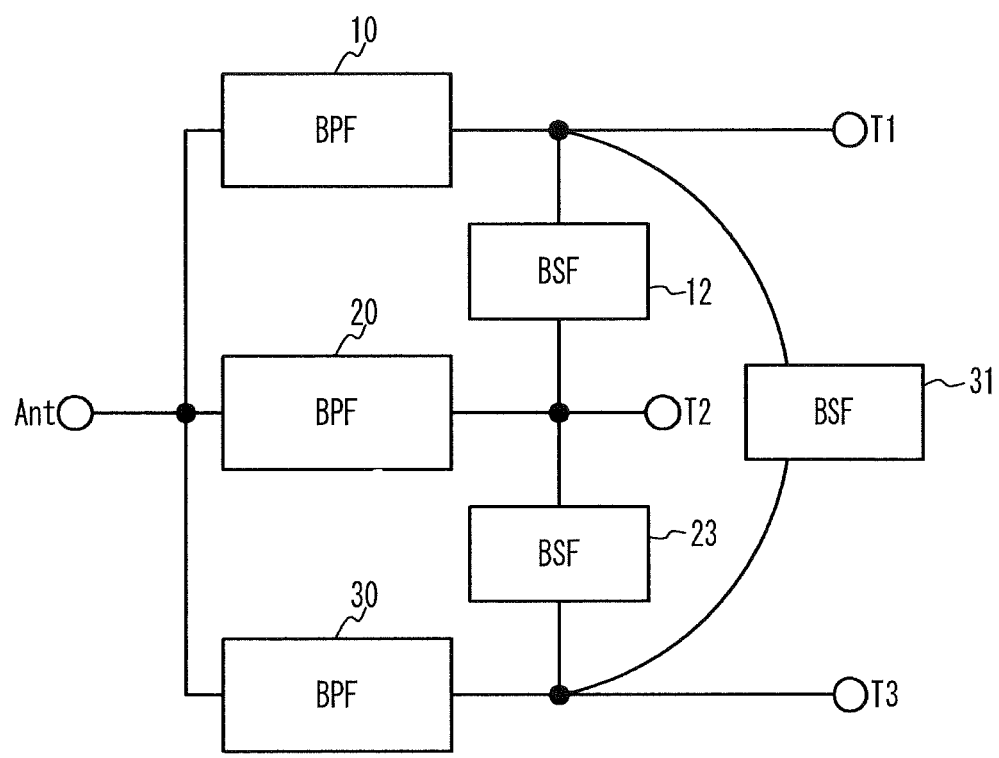
FIG. 12 is a circuit diagram of a multiplexer in accordance with a second embodiment.

FIG. 12 is a circuit diagram of a multiplexer in accordance with a second embodiment. As illustrated in FIG. 12, a BPF 30 is connected between the common terminal Ant and a terminal T3. A BSF 23 is connected between the terminals T2 and T3. A BSF 31 is connected between the terminals T3 and T1. Other configurations are the same as those of the first embodiment illustrated in FIG. 1, and the description thereof is thus omitted.

Simulation 2

Figure 13:
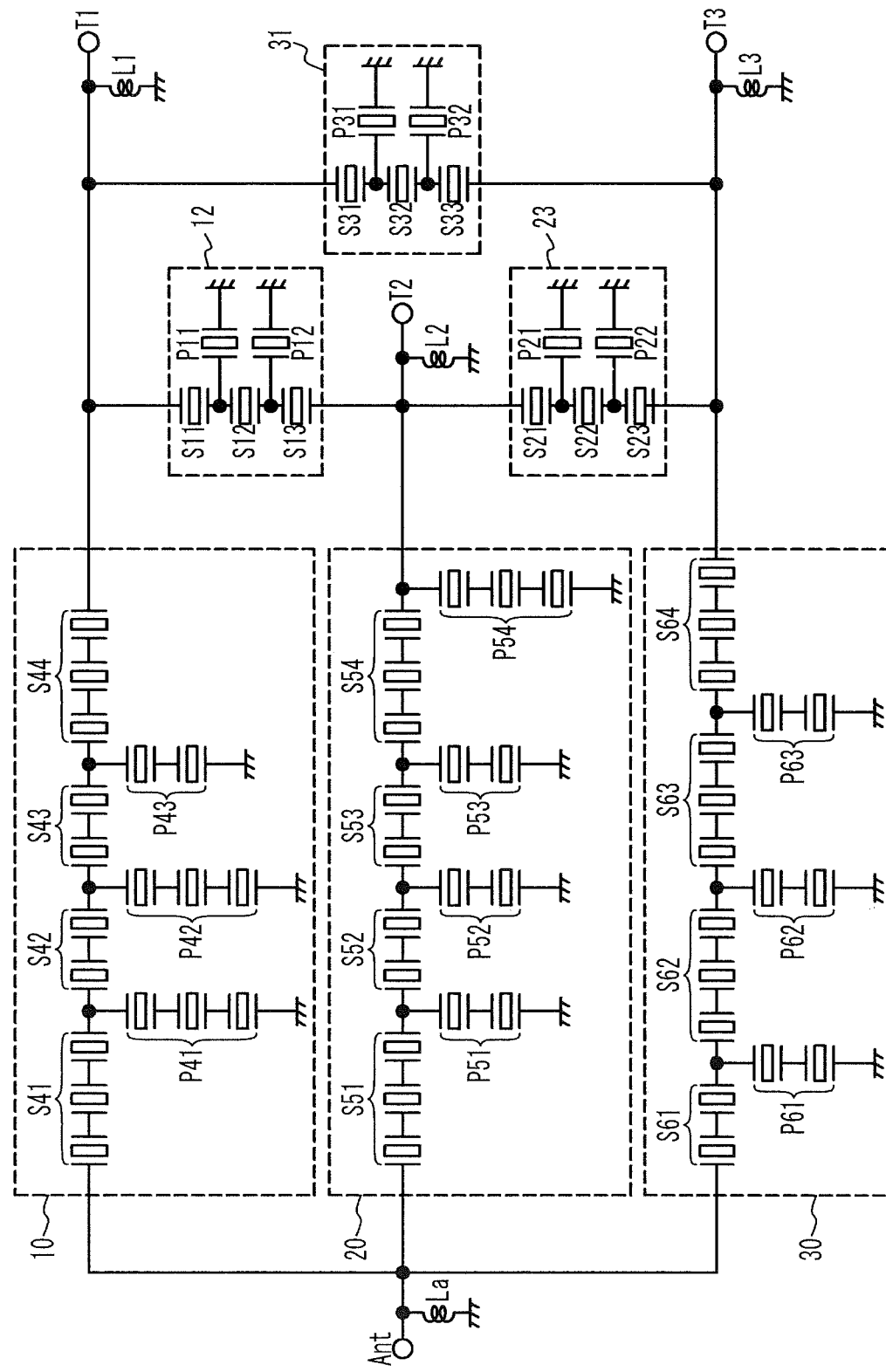
FIG. 13 is a circuit diagram of a multiplexer in simulation 2.

The characteristics of a multiplexer of the second embodiment were simulated. FIG. 13 is a circuit diagram of a multiplexer in simulation 2. In the BPF 10, series resonators S41 through S44 are connected in series between the common terminal Ant and the terminal T1, and parallel resonators P41 through P43 are connected in parallel between the common terminal Ant and the terminal T1. In the BPF 20, series resonators S51 through S54 are connected in series between the common terminal Ant and the terminal T2, and parallel resonators P51 through P54 are connected in parallel between the common terminal Ant and the terminal T2. In the BPF 30, series resonators S61 through S64 are connected in series between the common terminal Ant and the terminal T3, and parallel resonators P61 through P63 are connected in parallel between the common terminal Ant and the terminal T3.

In the BSF 12, series resonators S11 through S13 are connected in series between the terminals T1 and T2, and the parallel resonators P11 and P12 are connected in parallel between the terminals T1 and T2. In the BSF 23, series resonators S21 through S23 are connected in series between the terminals T2 and T3, and parallel resonators P21 and P22 are connected in parallel between the terminals T2 and T3. In the BSF 31, series resonators S31 through S33 are connected in series between the terminals T3 and T1, and parallel resonators P31 and P32 are connected in parallel between the terminals T3 and T1.

An inductor La is connected between the common terminal Ant and a ground. An inductor L1 is connected between the terminal T1 and a ground, an inductor L2 is connected between the terminal T2 and a ground, and an inductor L3 is connected between the terminal T3 and a ground. The inductors La and L1 through L3 are phase shift circuits.

Simulated were a multiplexer C with the BSFs 12, 23, and 31, which corresponds to the second embodiment, and a multiplexer D without the BSFs 12, 23, and 31, which corresponds to a second comparative example, under the following assumption. The BPF 10 is a filter for Band34 (band: 2010 MHz to 2025 MHz, a time division duplex (TDD) system), the BPF 20 is a filter for Band39 (band: 1880 MHz to 1920 MHz, the TDD system), and the BPF 30 is a filter supporting a part, which is from 2540 MHz to 2660 MHz, of Band41 (band: 2496 MHz to 2690 MHz, the TDD system).

The antiresonant frequencies Fas1 of the series resonators S11 through S13 of the BSF 12 are 1892 MHz and the resonant frequencies Frp1 of the parallel resonators P11 and P12 are 2020 MHz. The antiresonant frequencies Fas2 of the series resonators S21 through S23 of the BSF 23 are 1892 MHz and the resonant frequencies Frp2 of the parallel resonators P21 and P22 are 2640 MHz. The antiresonant frequencies Fas3 of the series resonators S31 through S33 of the BSF 31 are 2020 MHz and the resonant frequencies Frp3 of the parallel resonators P31 and P32 are 2635 MHz. The electrostatic capacitances of all the series resonators of the BSFs 12, 23, and 31 are 1 pF and the electrostatic capacitances of all the parallel resonators of the BSFs 12, 23, and 31 are 2.48 pF.

The inductances of the inductors La, L1, L2, and L3 in the multiplexer C are 2.4 nH, 7.6 nH, 10 nH, and 1.3 nH, respectively. The inductances of the inductors La, L1, L2, and L3 in the multiplexer D are 2.5 nH, 18 nH, 18 nH, and 3.0 nH.

Figure 14A:
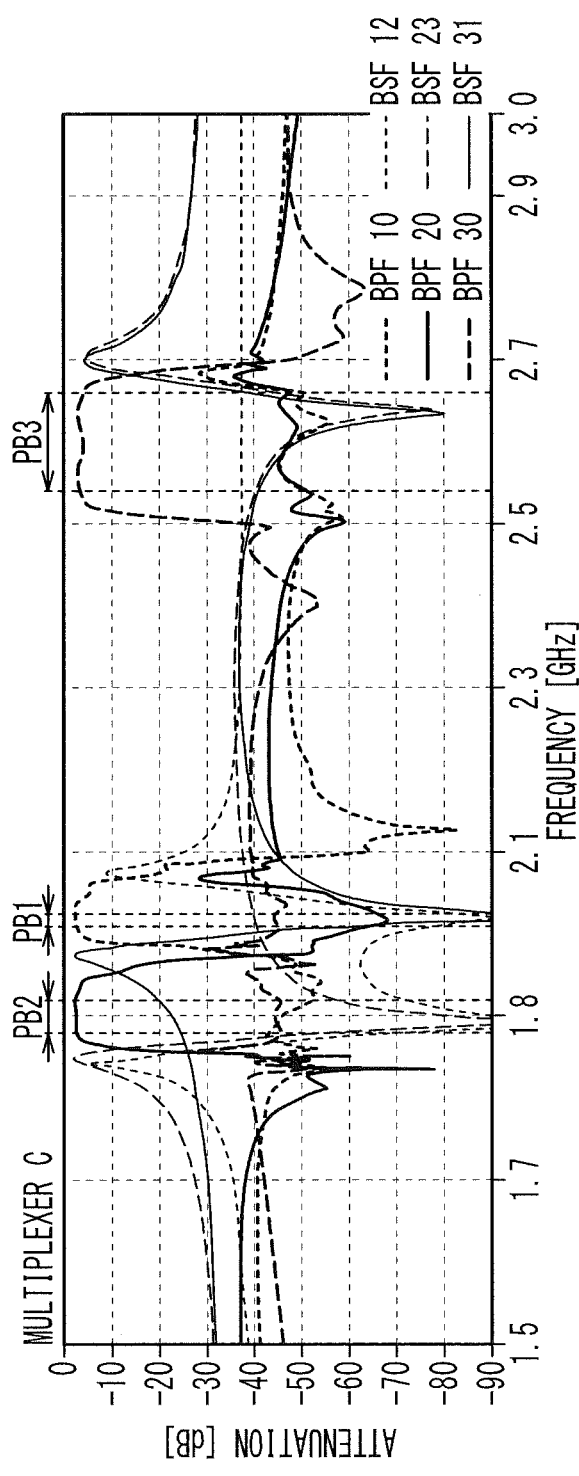
FIG. 14A illustrates the transmission characteristics of the BPFs and the BSFs of a multiplexer C in simulation 2.
Figure 14B:
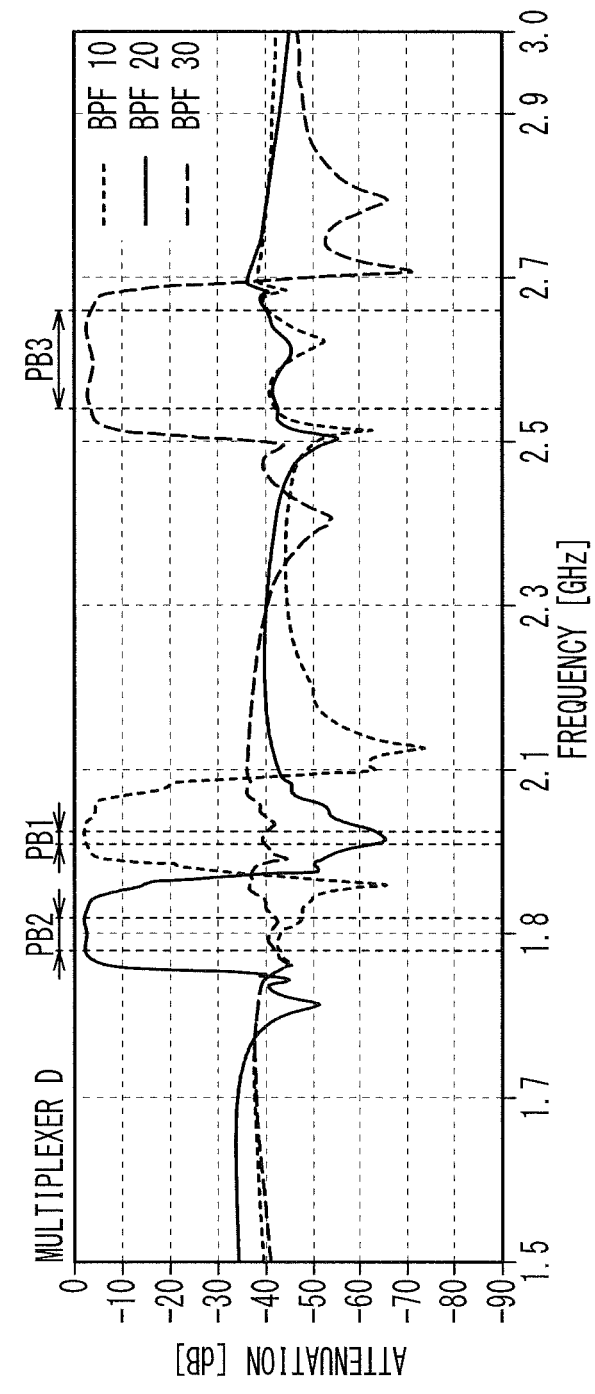
FIG. 14B illustrates the transmission characteristics of the BPFs of a multiplexer D.

FIG. 14A illustrates the transmission characteristics of the BPFs and the BSFs of the multiplexer C in simulation 2, and FIG. 14B illustrates the transmission characteristics of the BPFs of the multiplexer D. As illustrated in FIG. 14A, the passband PB1 of the BPF 10 includes the band, which is from 2010 MHz to 2025 MHz, of Band34, the passband PB2 of the BPF 20 includes the band, which is from 1880 MHz to 1920 MHz, of Band39, and the passband PB3 of the BPF 30 includes a part, which is from 2540 MHz to 2660, of the band of Band41. The stopband of the BSF 12 includes the passbands PB1 and PB2. The stopband of the BSF 23 includes the passbands PB2 and PB3. The stopband of the BSF 31 includes the passbands PB3 and PB1. As illustrated in FIG. 14B, the transmission characteristics of the BPFs 10, 20, and 30 are little different from each other between the multiplexers C and D. Thus, the provision of the BSFs 12, 23, and 31 hardly changes the transmission characteristics of the BPFs 10, 20, and 30.

Figure 15A:
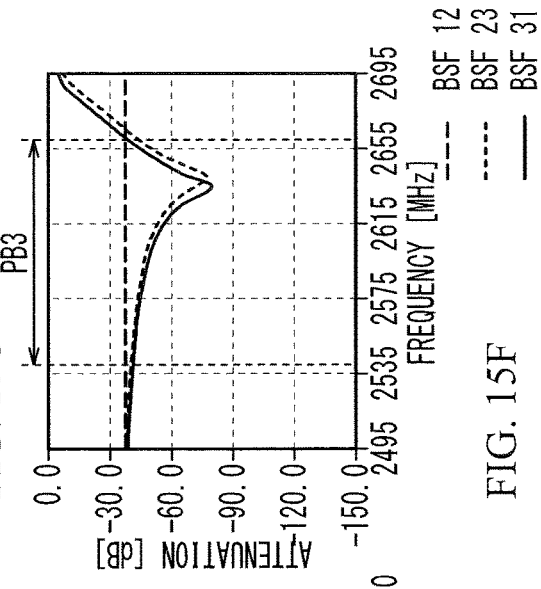
FIG. 15A through FIG. 15C illustrate the transmission characteristics of the BSFs around the passbands of the BPFs in simulation 2.
Figure 15B:
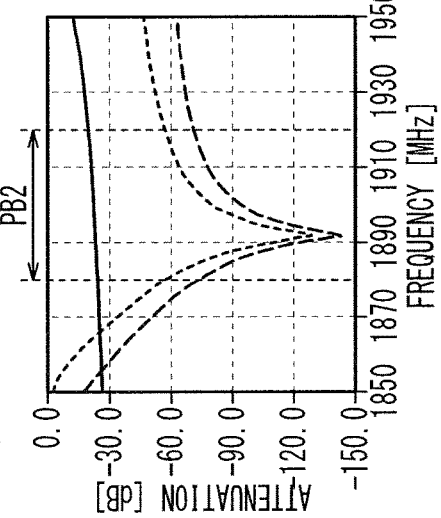
Figure 15D:
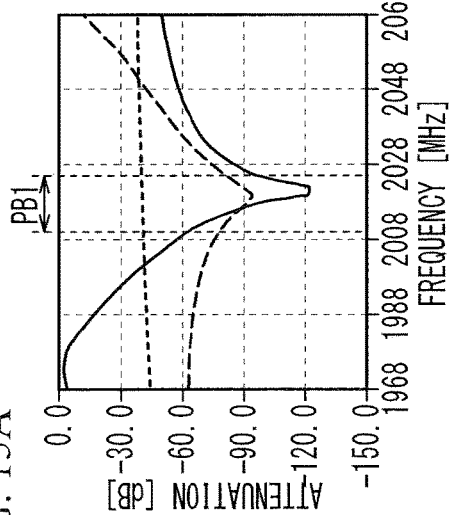
FIG. 15D through FIG. 15F illustrate the phases of the BSFs.
Figure 15C:
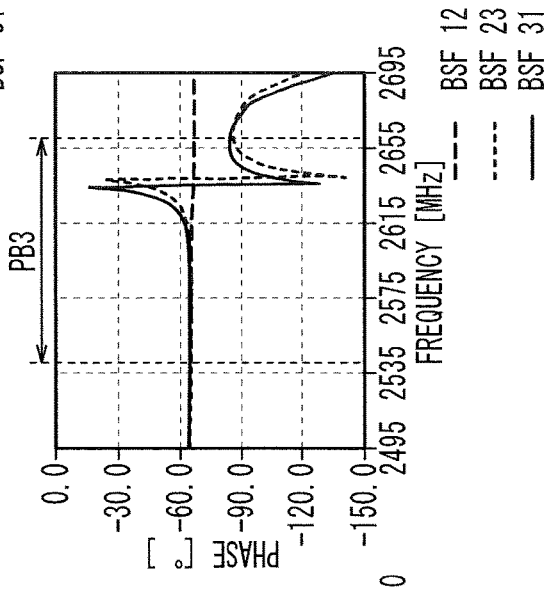
Figure 15E:
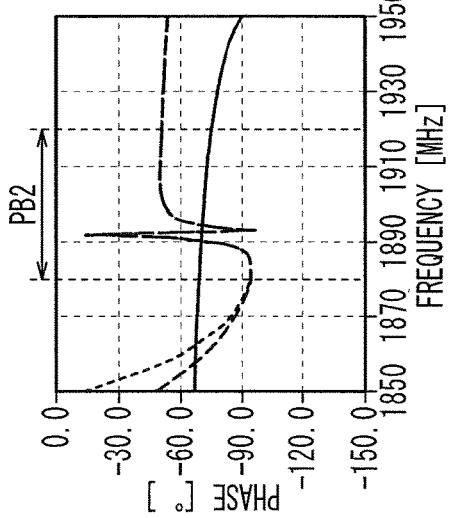
Figure 15F:
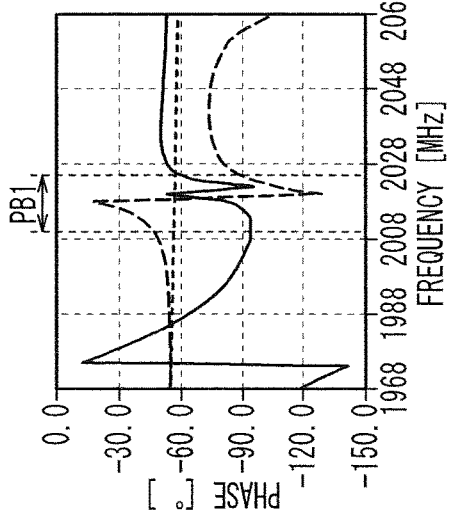

FIG. 15A through FIG. 15C illustrate the transmission characteristics of the BSFs in frequencies around the passbands of the BPFs in simulation 2, and FIG. 15D through FIG. 15F illustrate the phases of the BSFs. As illustrated in FIG. 15A, located within the passband PB1 are the attenuation pole formed mainly of the resonant frequencies Frp1 of the parallel resonators P11 and P12 of the BSF 12 and the attenuation pole formed mainly of the antiresonant frequencies Fas3 of the series resonators S31 through S33 of the BSF 31. The attenuation pole of the BSF 23 is not located within the passband PB1.

As illustrated in FIG. 15B, located within the passband PB2 are the attenuation pole formed mainly of the antiresonant frequencies Fas1 of the series resonators S12 and S13 of the BSF 12 and the attenuation pole formed mainly of the antiresonant frequencies Fas2 of the series resonators S21 through S23 of the BSF 23. The attenuation pole of the BSF 31 is not located within the passband PB2.

As illustrated in FIG. 15C, located within the passband PB3 are the attenuation pole formed mainly of the resonant frequencies Frp2 of the parallel resonators P21 and P22 of the BSF 23 and the attenuation pole formed mainly of the resonant frequencies Frp3 of the parallel resonators P31 and P32 of the BSF 31. The attenuation pole of the BSF 12 is not located within the passband PB3.

As illustrated in FIG. 15D, in the BSFs 12 and 31, the phase significantly varies in the passband PB1. In the BSF 23, the phase hardly varies in the passband PB1. As illustrated in FIG. 15E, in the BSFs 12 and 23, the phase significantly varies in the passband PB2. In the BSF 31, the phase hardly varies in the passband PB2. As illustrated in FIG. 15F, in the BSFs 23 and 31, the phase significantly varies in the passband PB3. In the BSF 12, the phase hardly varies in the passband PB2.

Figure 16C:
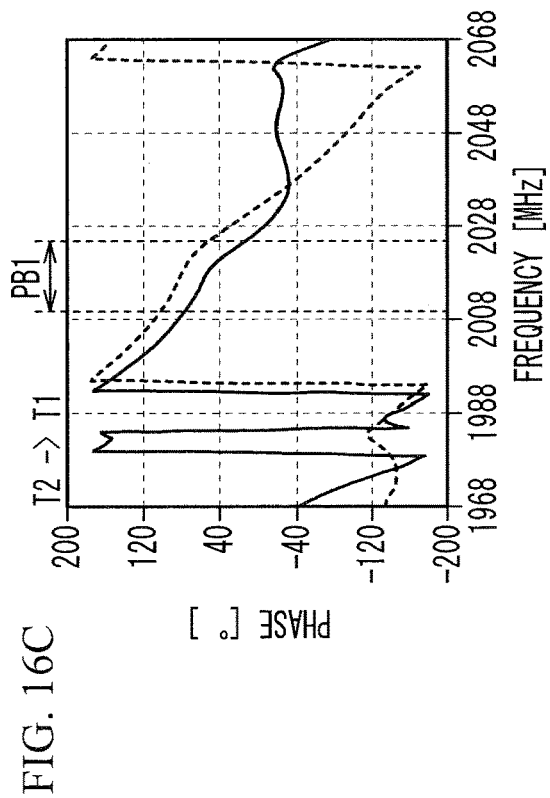
FIG. 16C illustrates the phases of the multiplexers.
Figure 16D:
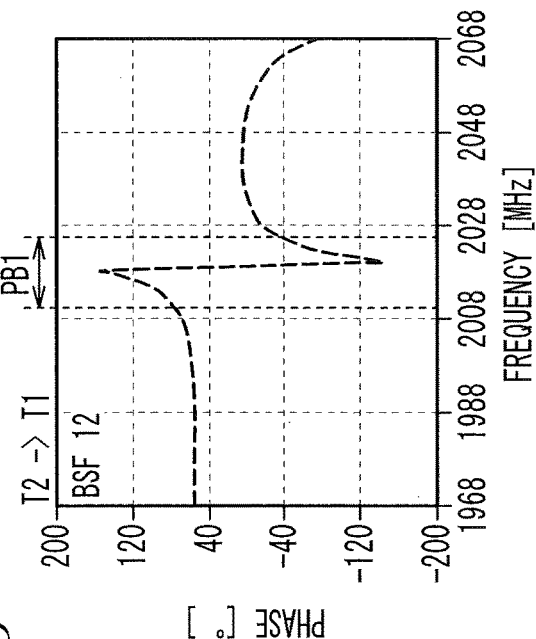
FIG. 16D illustrates the phase of the BSF 12.
Figure 16A:
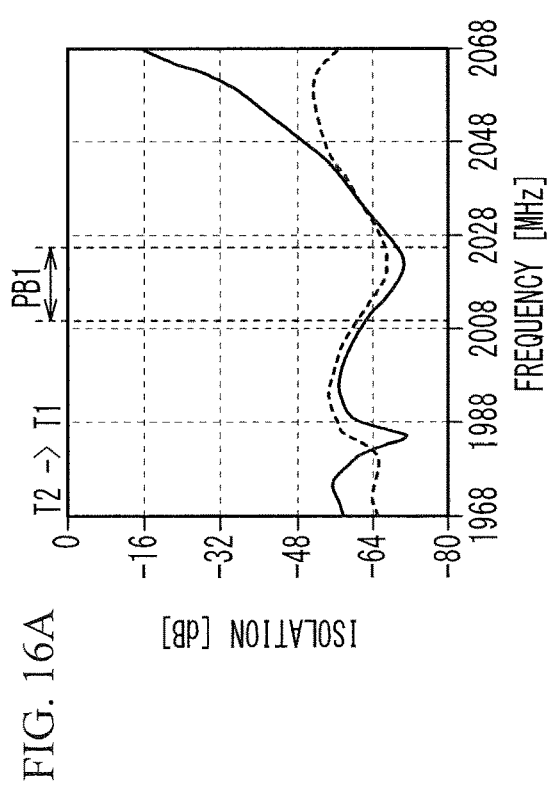
FIG. 16A illustrates the isolation characteristics from a terminal T2 to a terminal T1 of the multiplexers in simulation 2.
Figure 16B:
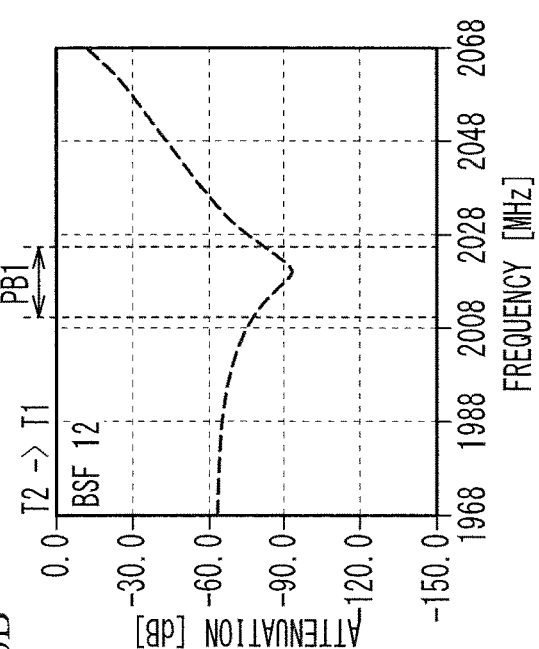
FIG. 16B illustrates the transmission characteristic from the terminal T2 to the terminal T1 of a BSF 12.

FIG. 16A illustrates the isolation characteristics from the terminal T2 to the terminal T1 of the multiplexers in simulation 2, FIG. 16B illustrates the transmission characteristic from the terminal T2 to the terminal T1 of the BSF 12, FIG. 16C illustrates the phases of the multiplexers, and FIG. 16D illustrates the phase of the BSF 12.

The isolation of the multiplexer D in the passband PB1 in FIG. 16A is substantially the same as the attenuation of the BSF 12 in the passband PB1 in FIG. 16B. When the phase of the multiplexer D in the passband PB1 in FIG. 16C is compared with the phase of the BSF 12 in the passband PB1 in FIG. 16D, the frequency range within which the absolute value of the phase difference between the multiplexer D and the BSF 12 is from 90° to 180° in PB1 is wide. Thus, the signal in the passband PB1 passing through the multiplexer D (i.e., the BPFs 20 and 10 of the multiplexer C) from the terminal T2 to the terminal T1 and the signal in the passband PB1 passing through the BSF 12 from the terminal T2 to the terminal T1 cancel each other out. Therefore, as illustrated in FIG. 16A, the isolation characteristic of the multiplexer C in the passband PB1 is better than that of the multiplexer D.

Figure 17A:
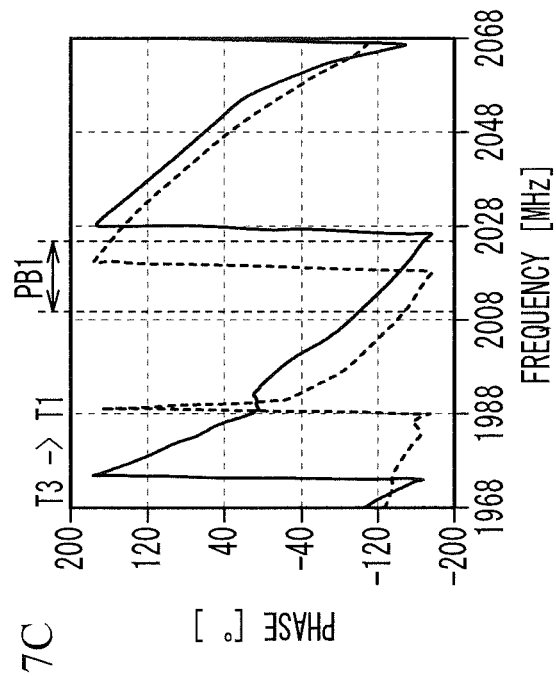
FIG. 17A illustrates the isolation characteristics from a terminal T3 to the terminal T1 of the multiplexers in simulation 2.
Figure 17C:
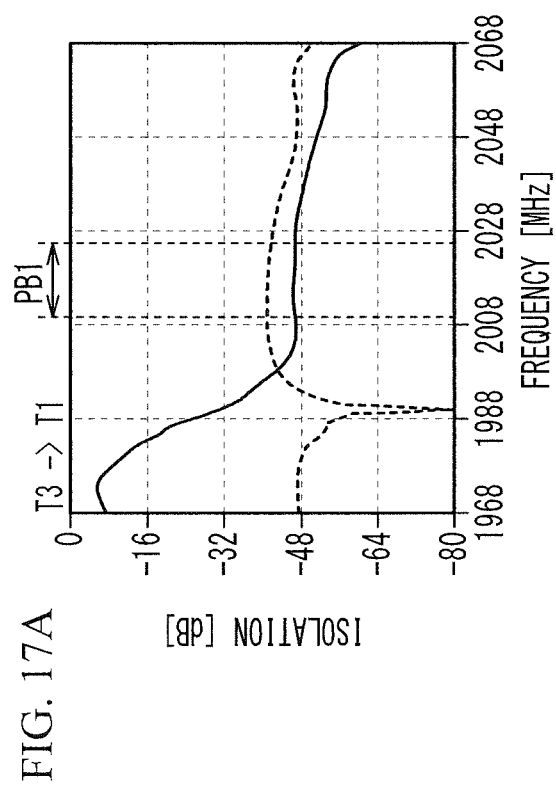
FIG. 17C illustrates the phases of the multiplexers.
Figure 17B:
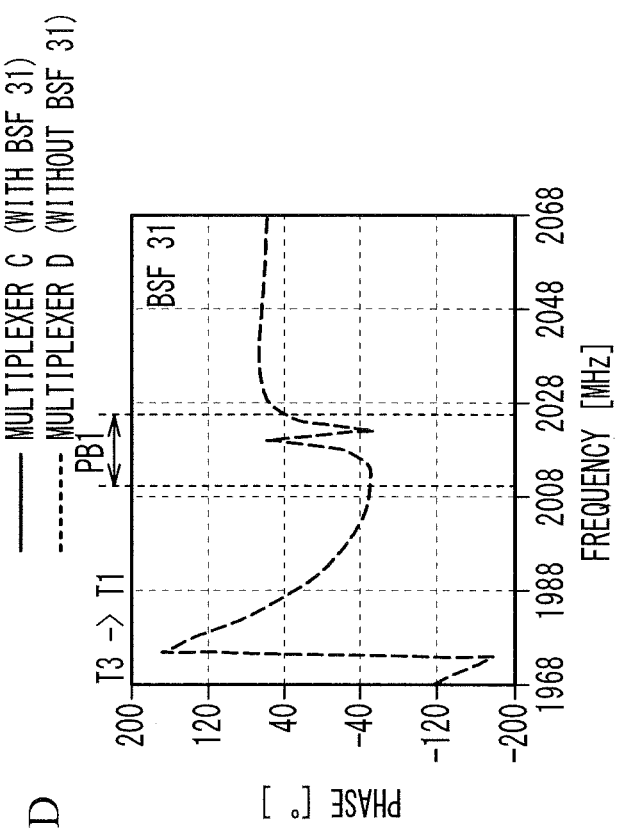
FIG. 17B illustrates the transmission characteristic from the terminal T3 to the terminal T1 of a BSF 31.
Figure 17D:
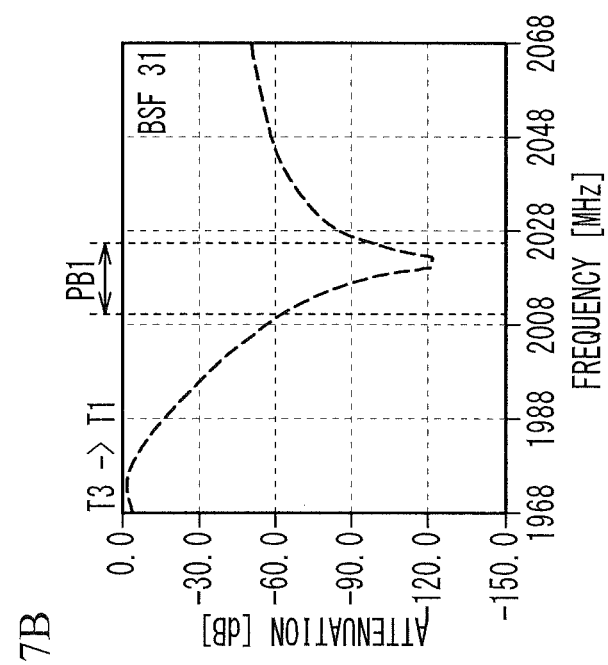
FIG. 17D illustrates the phase of the BSF 31.

FIG. 17A illustrates the isolation characteristics from the terminal T3 to the terminal T1 of the multiplexers in simulation 2, FIG. 17B illustrates the transmission characteristic from the terminal T3 to the terminal T1 of the BSF 31, FIG. 17C illustrates the phases of the multiplexers, and FIG. 17D illustrates the phase of the BSF 31.

As illustrated in FIG. 17A through FIG. 17D, the isolation of the multiplexer D in the passband PB1 is approximately the same as the attenuation of the BSF 31. When the phase of the multiplexer D in the passband PB1 is compared with the phase of the BSF 31 in the passband PB1, the frequency range within which the absolute value of the phase difference between the multiplexer D and the BSF 31 is from 90° to 180° in PB1 is wide. Accordingly, the signal in the passband PB1 passing through the multiplexer D (i.e., the BPFs 30 and 10 of the multiplexer C) from the terminal T3 to the terminal T1 and the signal in the passband PB1 passing through the BSF 31 from the terminal T3 to the terminal T1 cancel each other out. Thus, as illustrated in FIG. 17A, the isolation characteristic of the multiplexer C in the passband PB1 is better than that of the multiplexer D.

Figure 18C:
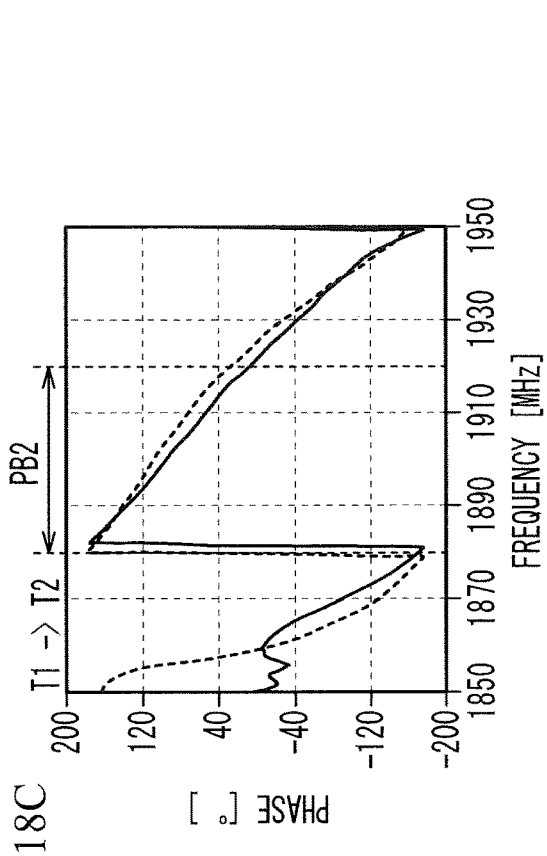
FIG. 18C illustrates the phases of the multiplexers.
Figure 18D:
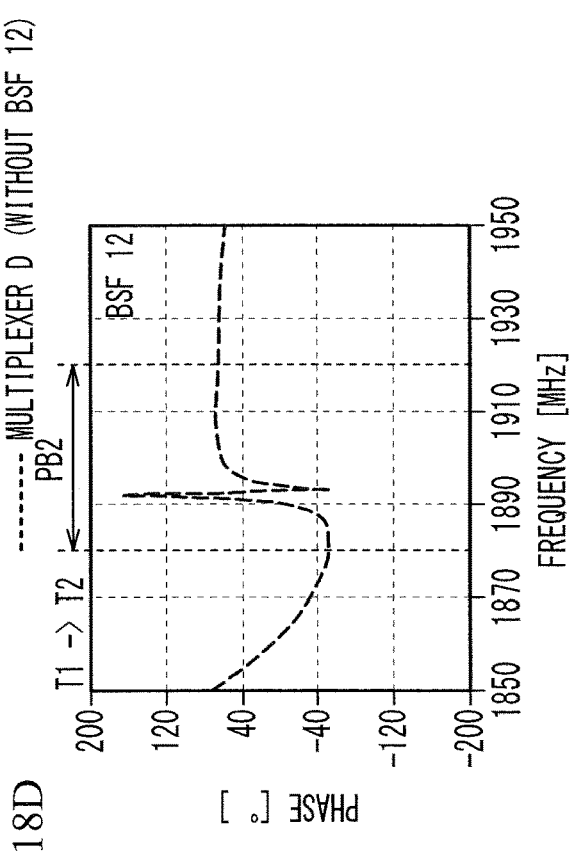
FIG. 18D illustrates the phase of the BSF 12.
Figure 18A:
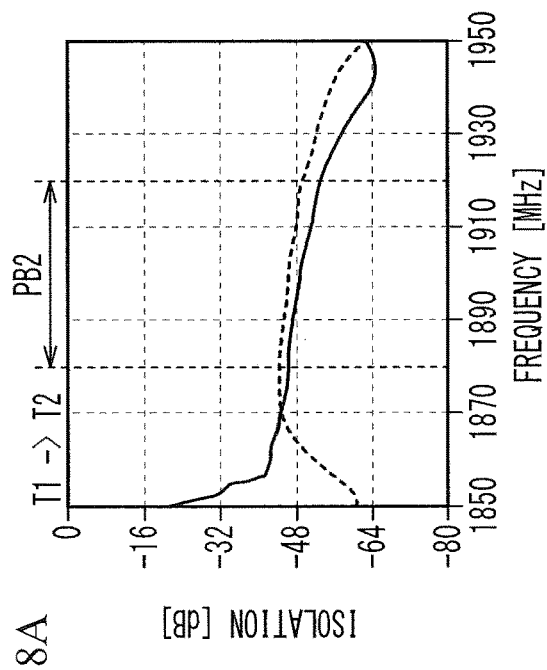
FIG. 18A illustrates the isolation characteristics from the terminal T1 to the terminal T2 of the multiplexers in simulation 2.
Figure 18B:
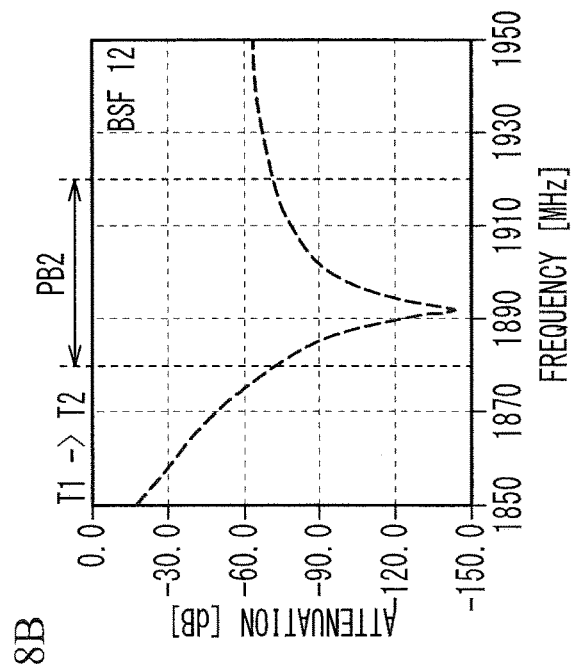
FIG. 18B illustrates the transmission characteristic from the terminal T1 to the terminal T2 of the BSF 12.

FIG. 18A illustrates the isolation characteristics from the terminal T1 to the terminal T2 of the multiplexers in simulation 2, FIG. 18B illustrates the transmission characteristic from the terminal T1 to the terminal T2 of the BSF 12, FIG. 18C illustrates the phases of the multiplexers, and FIG. 18D illustrates the phase of the BSF 12.

As illustrated in FIG. 18A through FIG. 18D, the isolation of the multiplexer D in the passband PB2 is substantially the same as the attenuation of the BSF 12 in the passband PB2. When the phase of the multiplexer D in the passband PB2 is compared with the phase of the BSF 12 in the passband PB2, the frequency range within which the absolute value of the phase difference between the multiplexer D and the BSF 12 is from 90° to 180° in PB2 is wide. Thus, the signal in the passband PB2 passing through the multiplexer D (i.e., the BPFs 10 and 20 of the multiplexer C) from the terminal T1 to the terminal T2 and the signal in the passband PB2 passing through the BSF 12 from the terminal T1 to the terminal T2 cancel each other out. Therefore, as illustrated in FIG. 18A, the isolation characteristic of the multiplexer C in the passband PB2 is better than that of the multiplexer D.

Figure 19C:
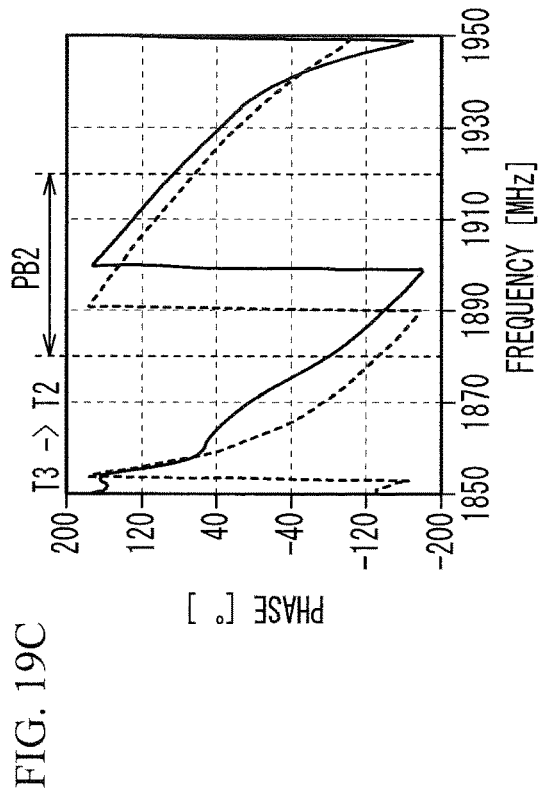
FIG. 19C illustrates the phases of the multiplexers.
Figure 19D:
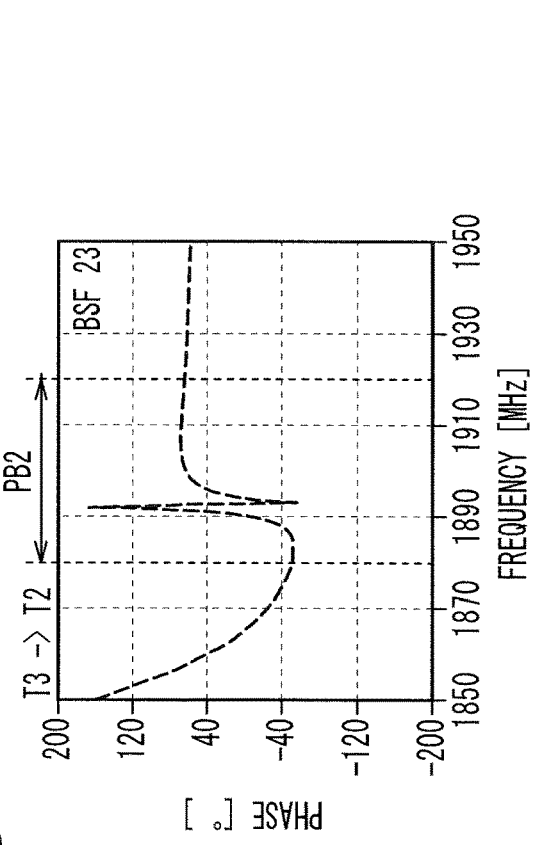
FIG. 19D illustrates the phase of the BSF 23.
Figure 19A:
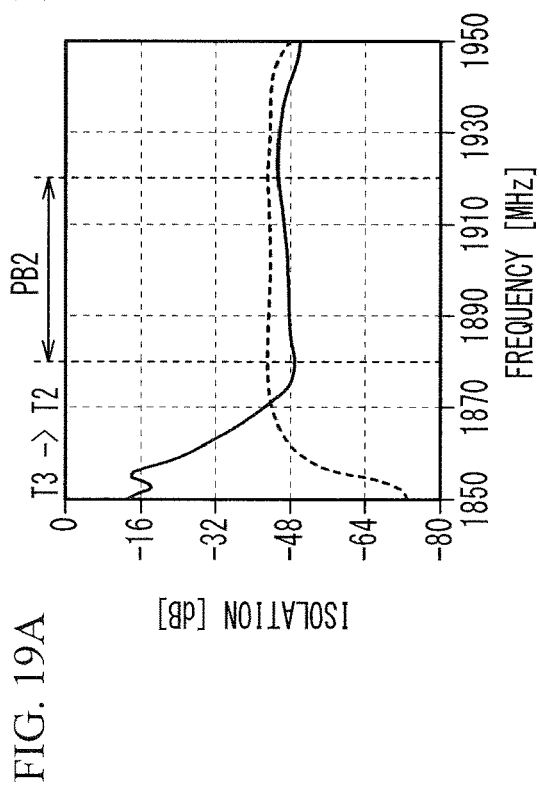
FIG. 19A illustrates the isolation characteristics from the terminal T3 to the terminal T2 of the multiplexers in simulation 2.
Figure 19B:
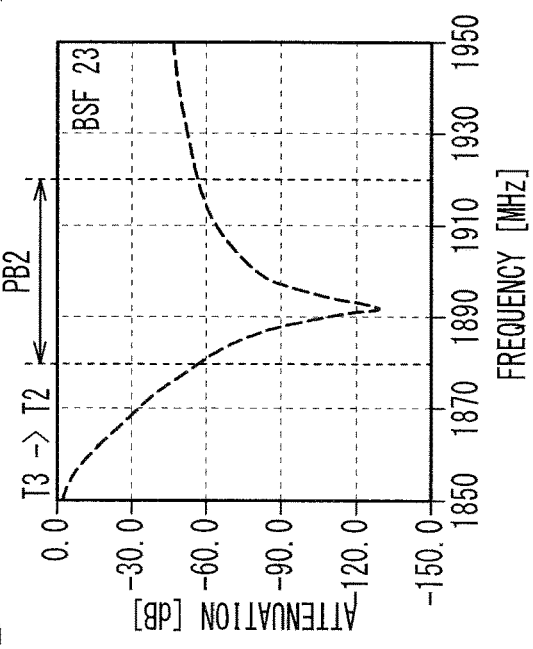
FIG. 19B illustrates the transmission characteristic from the terminal T3 to the terminal T2 of a BSF 23.

FIG. 19A illustrates the isolation characteristics from the terminal T3 to the terminal T2 of the multiplexers in simulation 2, FIG. 19B illustrates the transmission characteristic from the terminal T3 to the terminal T2 of the BSF 23, FIG. 19C illustrates the phases of the multiplexers, and FIG. 19D illustrates the phase of the BSF 23.

As illustrated in FIG. 19A through FIG. 19D, the isolation of the multiplexer D in the passband PB2 is substantially the same as the attenuation of the BSF 23 in the passband PB2. When the phase of the multiplexer D in the passband PB2 is compared with the phase of the BSF 23 in the passband PB2, the frequency range within which the absolute value of the phase difference between the multiplexer D and the BSF 23 is 90° to 180° in PB2 is wide. Thus, the signal in the passband PB2 passing through the multiplexer D (i.e., the BPFs 30 and 20 of the multiplexer C) from the terminal T3 to the terminal T2 and the signal in the passband PB2 passing through the BSF 23 from the terminal T3 to the terminal T2 cancel each other out. Therefore, as illustrated in FIG. 19A, the isolation characteristic of the multiplexer C in the passband PB2 is better than that of the multiplexer D.

Figure 20C:
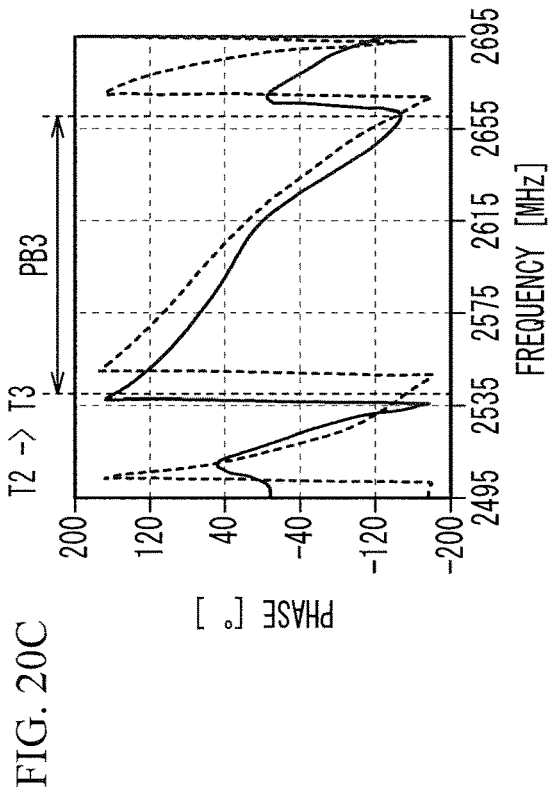
FIG. 20C illustrates the phases of the multiplexers.
Figure 20D:
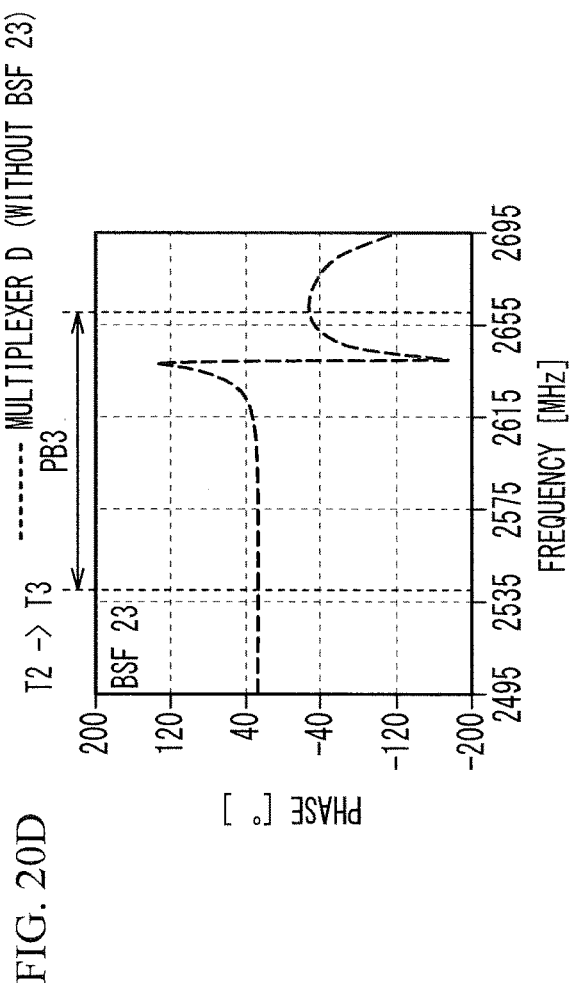
FIG. 20D illustrates the phase of the BSF 23.
Figure 20A:
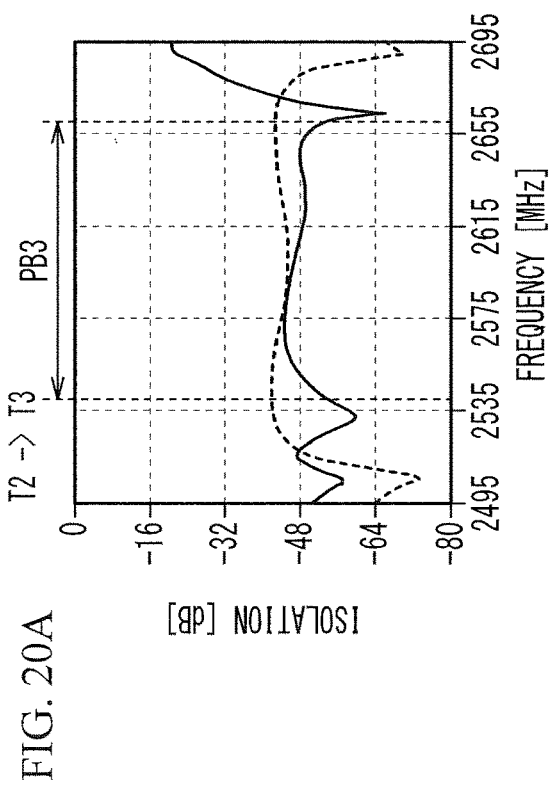
FIG. 20A illustrates the isolation characteristics from the terminal T2 to the terminal T3 of the multiplexers in simulation 2.
Figure 20B:
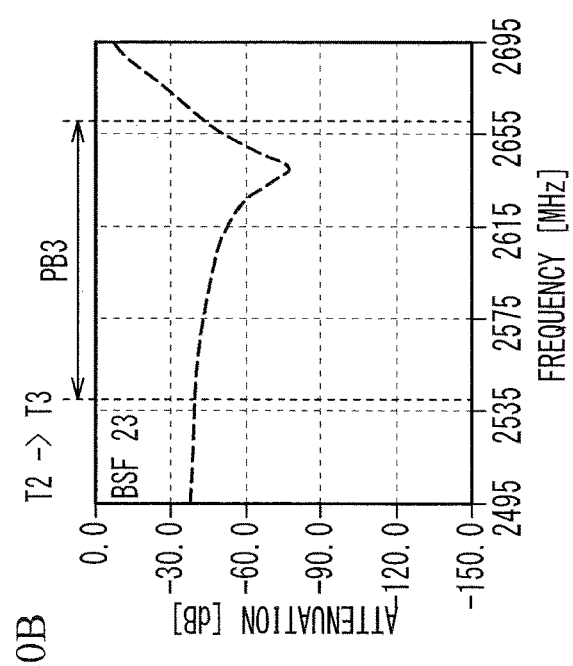
FIG. 20B illustrates the transmission characteristic from the terminal T2 to the terminal T3 of the BSF 23.

FIG. 20A illustrates the isolation characteristics from the terminal T2 to the terminal T3 of the multiplexers in simulation 2, FIG. 20B illustrates the transmission characteristic from the terminal T2 to the terminal T3 of the BSF 23, FIG. 20C illustrates the phases of the multiplexers, and FIG. 20D illustrates the phase of the BSF 23.

As illustrated in FIG. 20A through FIG. 20D, the isolation of the multiplexer D in the passband PB3 is substantially the same as the attenuation of the BSF 23 in the passband PB3. When the phase of the multiplexer D in the passband PB3 is compared with the phase of the BSF 23 in the passband PB3, the frequency range within which the absolute value of the phase difference between the multiplexer D and the BSF 23 is from 90° to 180° in PB3 is wide. Thus, the signal in the passband PB3 passing through the multiplexer D (i.e., the BPFs 20 and 30 of the multiplexer C) from the terminal T2 to the terminal T3 and the signal in the passband PB3 passing through the BSF 23 from the terminal T2 to the terminal T3 cancel each other out. Therefore, as illustrated in FIG. 20A, the isolation characteristic of the multiplexer C in the passband PB3 is better than that of the multiplexer D.

Figure 21A:
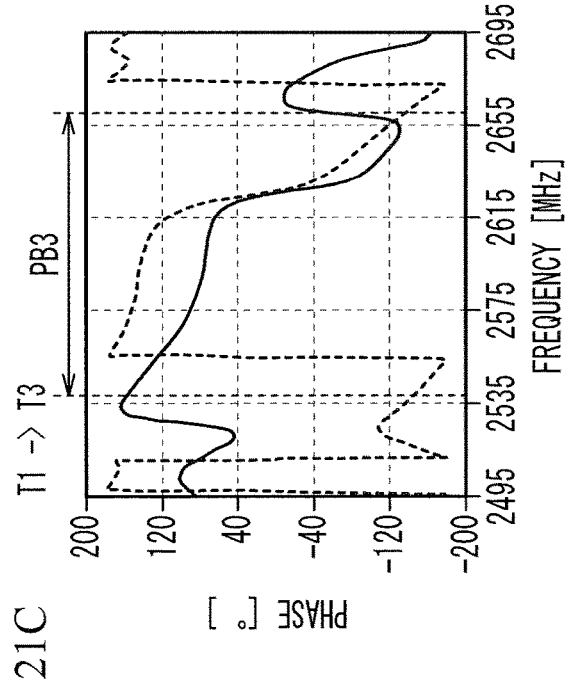
FIG. 21A illustrates the isolation characteristics from the terminal T1 to the terminal T3 of the multiplexers in simulation 2.
Figure 21B:
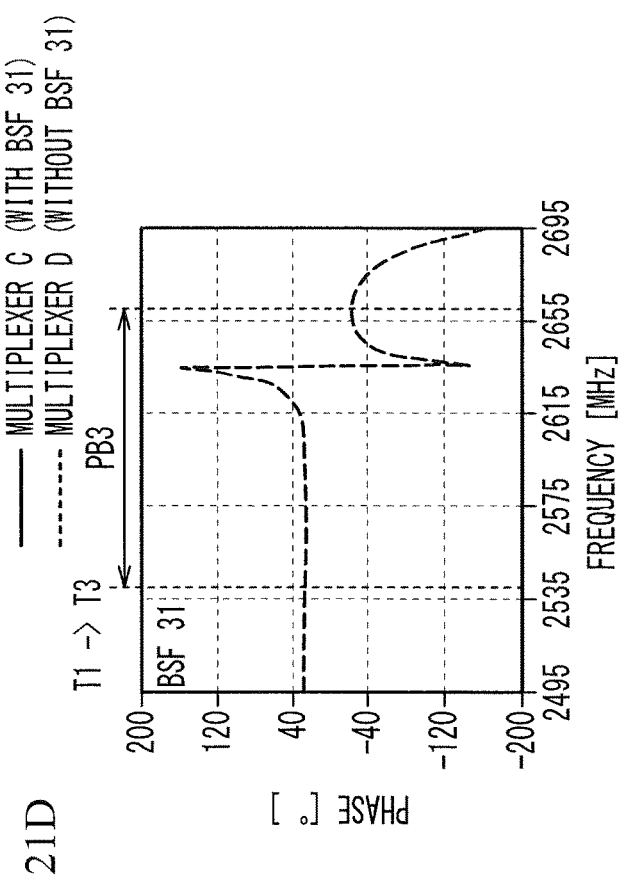
FIG. 21B illustrates the transmission characteristic from the terminal T1 to the terminal T3 of the BSF 31.
Figure 21C:
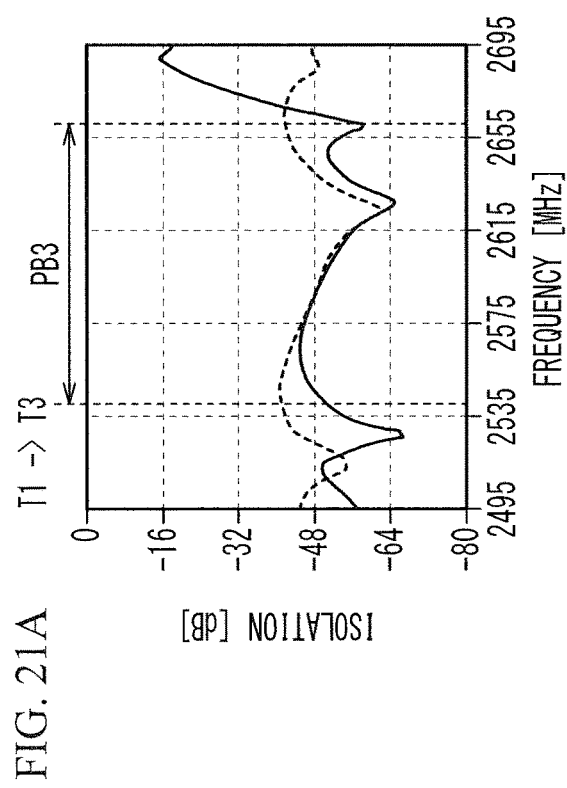
FIG. 21C illustrates the phases of the multiplexers.
Figure 21D:
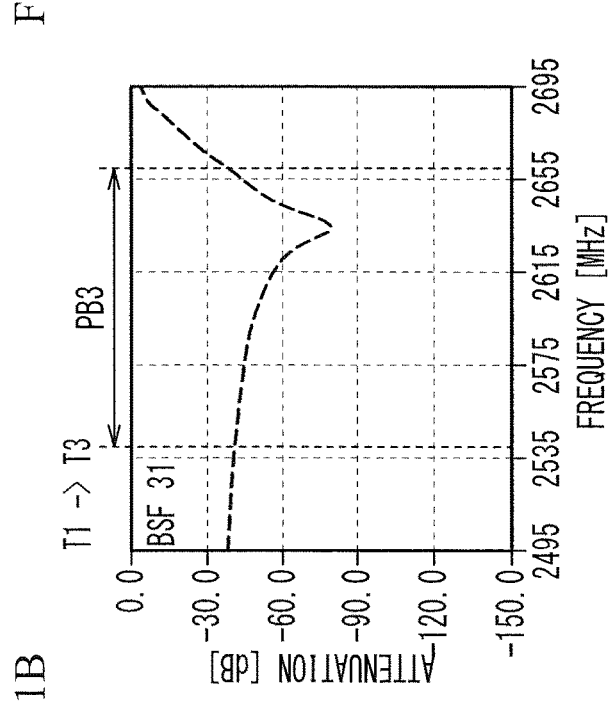
FIG. 21D illustrates the phase of the BSF 31.

FIG. 21A illustrates the isolation characteristics from the terminal T1 to the terminal T3 of the multiplexers in simulation 2, FIG. 21B illustrates the transmission characteristic from the terminal T1 to the terminal T3 of the BSF 31, FIG. 21C illustrates the phases of the multiplexers, and FIG. 21D illustrates the phase of the BSF 31.

As illustrated in FIG. 21A through FIG. 21D, the isolation of the multiplexer D in the passband PB3 is substantially the same as the attenuation of the BSF 31 in the passband PB3. When the phase of the multiplexer D in the passband PB3 is compared with the phase of the BSF 31 in the passband PB3, the frequency range within which the absolute value of the phase difference between the multiplexer D and the BSF 31 is from 90° to 180° in PB3 is wide. Thus, the signal in the passband PB3 passing through the multiplexer D (i.e., the BPFs 10 and 30 of the multiplexer C) from the terminal T1 to the terminal T3 and the signal in the passband PB3 passing through the BSF 31 from the terminal T1 to the terminal T3 cancel each other out. Thus, as illustrated in FIG. 21A, the isolation characteristic of the multiplexer C in the passband PB3 is better than that of the multiplexer D.

As described above, provision of the BSFs 12, 23, and 31 improves the isolation between each two of the terminals T1 through T3 in the passbands PB1 through PB3.

Figure 22:
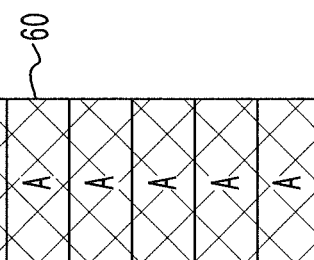
FIG. 22 summarizes the isolation characteristics between the terminals in simulation 2.

FIG. 22 summarizes the isolation characteristics between each two terminals in simulation 2. The terminal for which the isolation was evaluated is stored in the column "TERMINAL". The terminals between which the isolation was evaluated are stored in the column "BETWEEN TERMINALS". For example, when "T1" is stored in the column "TERMINAL" and "T2→T1" is stored in the column "BETWEEN TERMINALS", this means the isolation characteristic from the terminal T2 to the terminal T1 in the passband PB1. The column "BSF 12" indicates the isolation characteristic of the multiplexer to which only the BSF 12 is provided. The column "BSF 12 BSF 31" indicates the isolation characteristic of the multiplexer to which the BSFs 12 and 31 are provided but the BSF 23 is not provided. The column "BSF 12 BSF 23 BSF 31" indicates the isolation characteristic of the multiplexer to which the BSFs 12, 23, and 31 are provided.

"A", "B", and "C" of the isolation characteristic are indicators that indicate the degree of improvement in the isolation characteristic from the multiplexer D to which none of the BSFs 12, 23, and 31 are provided. "D" indicates that the isolation characteristic is not improved. "C" indicates that the isolation characteristic is improved a little. "B" indicates that the isolation characteristic is improved. "A" indicates that the isolation characteristic is significantly improved.

As presented in FIG. 22, when at least one of the BSFs 12, 23, and 31 is provided, the isolation characteristic of at least one of the terminals improves. As indicated by a hatched region 60, when all of the BSFs 12, 23, and 31 are provided, the isolation characteristics between all the terminals significantly improve.

Figure 23:
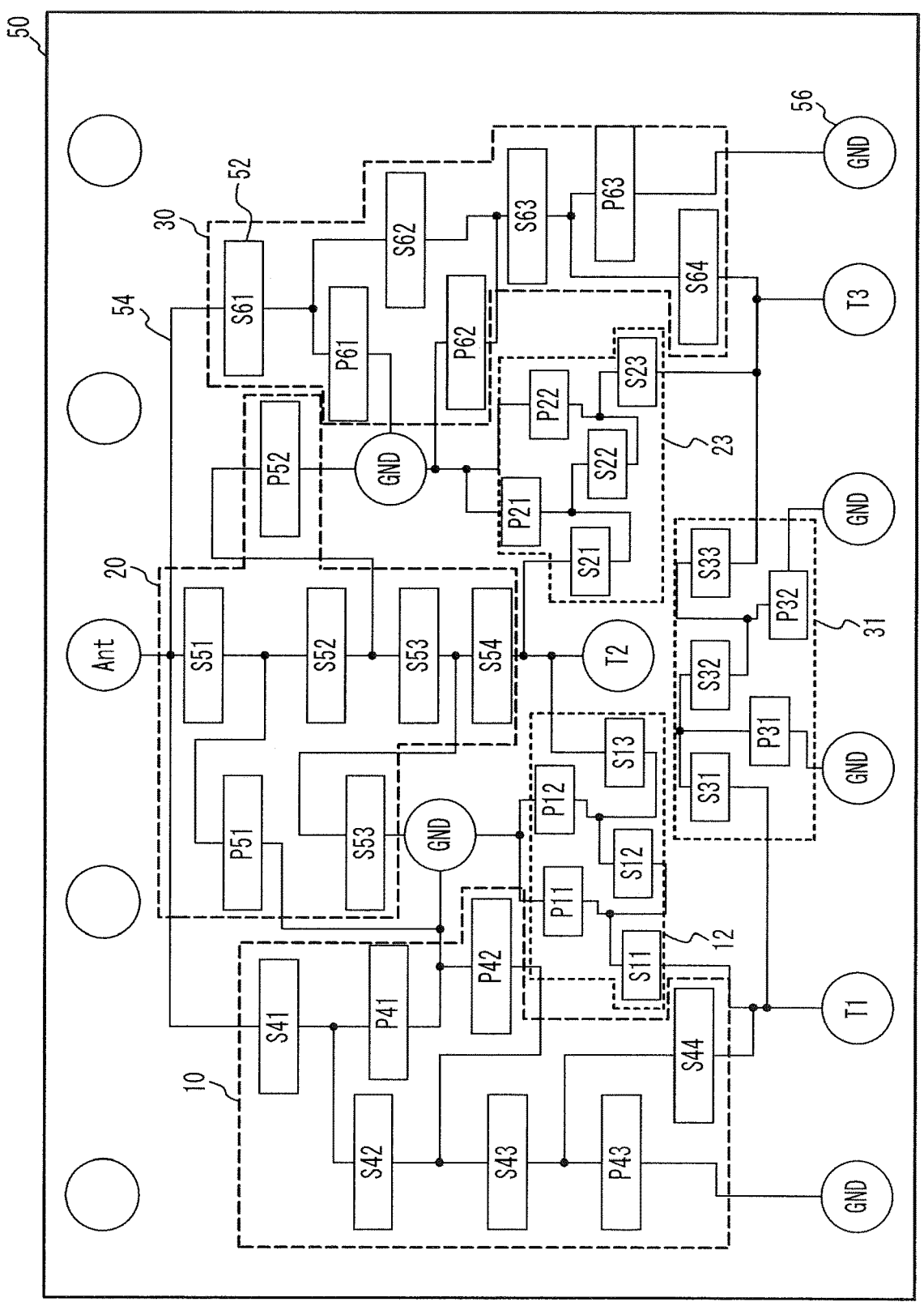
FIG. 23 is a plan view of a multiplexer in accordance with the second embodiment.

FIG. 23 illustrates a plan view of a multiplexer in accordance with the second embodiment. As illustrated in FIG. 23, acoustic wave resonators 52, wiring lines 54, and bumps 56 are located on the substrate 50. The acoustic wave resonators 52 are the surface acoustic wave resonators illustrated in FIG. 4A or the piezoelectric thin film resonators illustrated in FIG. 4B. The wiring lines 54 are formed of a metal film such as, but not limited to, an aluminum film, a gold film, or a copper film, and electrically connect between the acoustic wave resonators 52 and electrically connect the acoustic wave resonators 52 and the bumps 56. The bumps 56 are metal bumps, and are electrically connected to external elements. The bumps 56 correspond to the common terminal Ant, the terminals T1 through T3, and ground terminals GND.

As illustrated in FIG. 23, the BPFs 10, 20, and 30 and the BSFs 12, 23, and 31 may be formed on the same substrate 50. The BPFs 10, 20, and 30 and the BSFs 12, 23, and 31 may be formed on different substrates.

In the first embodiment, as illustrated in FIG. 1, the BPF 10 (a first bandpass filter) has a first end coupled to the common terminal Ant and a second end coupled to the terminal T1 (a first terminal). The BPF 20 (a second bandpass filter) has a first end coupled to the common terminal Ant and a second end coupled to the terminal T2 (a second terminal). The BSF 12 (a first band-stop filter) has a first end coupled to the terminal T1 and a second end coupled to the terminal T2. As illustrated in FIG. 6, the BPF 10 has the passband PB1 (a first passband). The BPF 20 has the passband PB2 (a second passband) that does not overlap with PB1 and is higher than PB1. The BSF 12 has the stopband SB1 (a first stopband) formed of a first attenuation pole (Fas1 and Fas2) located within PB1 or near PB1 and a second attenuation pole (Frp1 and Frp2) located within PB2 or near PB2.

As illustrated in FIG. 1 and FIG. 6, the signal A12 in PB2, which reaches the terminal T2 from the terminal T1 through the BPFs 10 and 20, passes through the stopband of the BPF 20. Thus, the stopband SB1 of the BSF 12 is provided in PB2. This configuration makes the amplitude of the signal B12 in PB2, which reaches the terminal T2 from the terminal T1 through the BSF 12, substantially equal to the amplitude of the signal A12. Similarly, the signal A21 in PB1, which reaches the terminal T1 from the terminal T2 through the BPFs 20 and 10, passes through the stopband of the BPF 10. Thus, the stopband SB1 of the BSF 12 is provided in PB1. This configuration makes the amplitude of the signal B12 in PB1, which reaches the terminal T1 from the terminal T2 through the BSF 12, substantially equal to the amplitude of the signal A21. Thus, the isolation characteristic between the terminals T1 and T2 is improved.

The term "the attenuation pole is located near the passband" means that the attenuation pole is located near the passband to the extent that the advantages of the first and second embodiments are achieved. For example, the center of the attenuation pole is identical to the center of the passband, and is located within the band of which the width is four times the width of the passband (for example, when PB1 is from 1535 MHz to 1555 MHz, the band is from 1505 MHz to 1585 MHz). The attenuation pole is preferably located within the band of which the width is three times the width of the passband, is more preferably located within the band of which the width is two times the width of the passband, and is further preferably located within the band of which the width is 1.5 times the width of the passband.

As illustrated in FIG. 7B, the absolute value of the phase difference between the signal A12 in PB2, which passes through the BPFs 10 and 20 from the terminal T1 to the terminal T2, and the signal B12 in PB2, which passes through the BSF 12 from the terminal T1 to the terminal T2, is greater than 90° in at least a part of PB2. The absolute value of the phase difference between the signal A21 in PB1, which passes through the BPFs 20 and 10 from the terminal T2 to the terminal T1, and the signal B21 in PB1, which passes through the BSF 12 from the terminal T2 to the terminal T1, is greater than 90° in at least a part of PB1. Thus, the isolation characteristic between the terminals T1 and T2 is further improved. The absolute value of the phase difference between the signals A12 and B12 and the absolute value of the phase difference between the signals A21 and B21 are preferably 100° or greater, more preferably 120° or greater. The phase difference between the signals A12 and B12 is preferably greater than 90° in at least half of the range of PB2, and is more preferably greater than 90° in the entire range of PB2. The phase difference between the signals A21 and B21 is preferably greater than 90° in at least half of the range of PB1, and is more preferably greater than 90° in the entire range of PB1.

As illustrated in FIG. 5, the BSF 12 includes one or more series resonators S11 and S12 connected in series between the terminals T1 and T2 and one or more parallel resonators P11 and P12 connected in parallel between the terminals T1 and T2. Thus, the signals A12 and B12 can be made to have approximately the same amplitude and substantially opposite phases, and the signals A21 and B21 can be made to have approximately the same amplitude and substantially opposite phases. A series resonator and/or a parallel resonator is not necessarily provided to the BSFs 12, 23, and/or 31. The BSFs 12, 23, and/or 31 may include an inductor and/or a capacitor.

As illustrated in FIG. 6, the antiresonant frequencies Fas1 and Fas2 of one or more series resonators S11 and S12 are located within PB1 or near PB1. The resonant frequencies Frp1 and Frp2 of one or more parallel resonators P11 and P12 are located within PB2 or near PB2. Thus, the signals A12 and B12 can be made to have approximately the same amplitude and have substantially opposite phases, and the signals A21 and B21 can be made to have approximately the same amplitude and have substantially opposite phases.

The average value of the antiresonant frequencies Fas1 and Fas2 of one or more series resonators S11 and S12 is located within PB1. The average value of the resonant frequencies Frp1 and Frp2 of one or more parallel resonators P11 and P12 is located within PB2. Thus, the signals A12 and B12 can be made to have approximately the same amplitude and have substantially opposite phases, and the signals A21 and B21 can be made to have approximately the same amplitude and have substantially opposite phases.

In the BSF 12, when two or more series resonators have the same antiresonant frequency, or when the number of series resonators is one, the antiresonant frequency of the series resonator is preferably located within PB1. When two or more parallel resonators have the same resonant frequency or when the number of parallel resonators is one, the resonant frequency of the parallel resonator is preferably located within PB2.

As illustrated in FIG. 6, when two or more series resonators S11 and S12 are provided, the antiresonant frequency of one of the series resonators S11 and S12 is lower than PB1, and the antiresonant frequency of another of the series resonators S11 and S12 is higher than PB1. When two or more parallel resonators P11 and P12 are provided, the resonant frequency of one of the parallel resonators P11 and P12 is lower than PB2, and the resonant frequency of another of the parallel resonators P11 and P12 is higher than PB2. Thus, the signals A12 and B12 can be made to have approximately the same amplitude and have substantially opposite phases, and the signals A21 and B21 can be made to have approximately the same amplitude and have substantially opposite phases.

The series resonators S11 and S12 and the parallel resonators P11 and P12 are acoustic wave resonators. Thus, the signals A12 and B12 can be made to have approximately the same amplitude and have substantially opposite phases, and the signals A21 and B21 can be made to have approximately the same amplitude and have substantially opposite phases.

The BPFs 10 and 20 and the BSF 12 include acoustic wave resonators. Thus, the attenuations of the stopbands of the BPFs 10 and 20 and the BSF 12 can be made approximately the same. Thus, the signals A12 and B12 can be made to have approximately the same amplitude and have substantially opposite phases, and the signals A21 and B21 can be made to have approximately the same amplitude and have substantially opposite phases. As illustrated in FIG. 2B and FIG. 2C, the BSF may include an element other than the acoustic wave resonator.

The BPFs 10 and 20 and the BSF 12 are ladder-type filters in which the acoustic wave resonators are connected in a ladder form. Thus, the attenuations of the stopbands of the BPFs 10 and 20 and the BSF 12 can be made approximately the same. Thus, the signals A12 and B12 can be made to have approximately the same amplitude and have substantially opposite phases, and the signals A21 and B21 can be made to have approximately the same amplitude and have substantially opposite phases. The BPFs 10 and 20 may be multimode type filters.

In the second embodiment, as illustrated in FIG. 12, the BPF 30 (a third bandpass filter) has a first end coupled to the common terminal Ant and a second end coupled to the terminal T3 (a third terminal). The BSF 23 (a second band-stop filter) has a first end coupled to the terminal T2 and a second end coupled to the terminal T3. The BSF 31 (a third band-stop filter) has a first end coupled to the terminal T3 and a second end coupled to the terminal T1. As illustrated in FIG. 14A, the BPF 30 has the passband PB3 (a third passband) that overlaps with none of PB1 and PB2, and is higher than PB1 and PB2. The BSF 23 has a second stopband formed of a third attenuation pole located within PB2 or near PB2 and a fourth attenuation pole located within PB3 or near PB3. The BSF 31 has a third stopband formed of a fifth attenuation pole located within PB3 or near PB3 and a sixth attenuation pole located within PB1 or near PB1. Thus, as illustrated in FIG. 22, the isolation between each two of the terminals T1 through T3 is improved.

The first and second embodiments have described a case where the number of BPFs is two or three, but the number of BPFs may be four or more. It is sufficient if at least one BSF is provided. The second embodiment has described a case where the BPFs 10, 20, and 30 are filters for a band of the TDD system, but the BPFs 10, 20, and 30 may be a receive filter and/or a transmit filter of the frequency division duplex (FDD) system.

Although the embodiments of the present invention have been described in detail, it is to be understood that the various change, substitutions, and alterations could be made hereto without departing from the spirit and scope of the invention.

What is claimed is:

1. A multiplexer comprising:
a first bandpass filter having a first end coupled to a common terminal and a second end coupled to a first terminal, the first bandpass filter having a first passband;
a second bandpass filter having a first end coupled to the common terminal and a second end coupled to a second terminal, the second bandpass filter having a second passband that does not overlap with the first passband and is higher than the first passband; and
a first band-stop filter having a first end coupled to the first terminal and a second end coupled to the second terminal, including one or more series resonators and one or more parallel resonators, the one or more series resonators being connected in series between the first terminal and the second terminal, a first end of each of the one or more parallel resonators being connected to a line between the first terminal and the second terminal, a second end of each of the one or more parallel resonators being connected to a ground, antiresonant frequencies of the one or more series resonators being located within a first band, resonant frequencies of the one or more parallel resonators being located within a second band, a center frequency of the first band being identical to a center frequency of the first passband, a width of the first band being 1.5 times a width of the first passband, a center frequency of the second band being identical to a center frequency of the second passband, and a width of the second band being 1.5 times a width of the second passband.

2. The multiplexer according to claim 1, wherein
an absolute value of a phase difference between a first signal in the second passband and a second signal in the second passband is greater than 90° in at least a part of the second passband, the first signal in the second passband passing through the first bandpass filter and, the second bandpass filter from the first terminal to the second terminal, the second signal in the second passband passing through the first band-stop filter from the first terminal to the second terminal, and
an absolute value of a phase difference between a third signal in the first passband and a fourth signal in the first passband is greater than 90° in at least a part of the first passband, the third signal in the first passband passing through the second bandpass filter and the first bandpass filter from the second terminal to the first terminal, the fourth signal in the first passband passing through the first band-stop filter from the second terminal to the first terminal.

3. The multiplexer according to claim 1, further comprising:
a third bandpass filter having a first end coupled to the common terminal and a second end coupled to a third terminal, the third bandpass filter having a third passband that overlaps with none of the first passband and the second passband, and is higher than the second passband;

a second band-stop filter having a first end coupled to the second terminal and a second end coupled to the third terminal, the second band-stop filter having a second stopband formed of a third attenuation pole and a fourth attenuation pole, the third attenuation pole being located within the second passband or near the second passband, the fourth attenuation pole being located in the third passband or near the third passband; and a third band-stop filter having, a first end coupled to the third terminal and a second end coupled to the first terminal, the third band-stop filter having a third stopband formed of a fifth attenuation pole and a sixth attenuation pole, the fifth attenuation pole being located within the third passband or near the third passband, the sixth attenuation pole being located within the first passband or near the first passband.

4. The multiplexer according to claim 1, wherein
an average value of the antiresonant frequencies of the one or more series resonators is located within the first passband, and
an average value of the resonant frequencies of the one or more parallel resonators is located within the second passband.

5. The multiplexer according to claim 1, wherein
the one or more series resonators includes a plurality of series resonators,
an antiresonant frequency of one of the series resonators is lower than the first passband, and an antiresonant frequency of another of the series resonators is higher than the first passband,
the one or more parallel resonators include a plurality of parallel resonators, and
a resonant frequency of one of the parallel resonators is lower than the second passband, and a resonant frequency of another of the parallel resonators is higher than the second passband.

6. The multiplexer according to claim 1, wherein
the one or more series resonators and the one or more parallel resonators are acoustic wave resonators.

7. The multiplexer according, to claim 6, wherein the first bandpass filter and the second bandpass filter include an acoustic wave resonator.

8. The multiplexer according to claim 6, wherein the first bandpass filter and the second bandpass filter are ladder-type filters in which acoustic wave resonators are connected in a ladder configuration.

9. A multiplexer comprising:
a first bandpass filter having a first end coupled to a common terminal and a second end coupled to a first terminal, the first bandpass filter having a first passband;
a second bandpass filter having a first end coupled to the common terminal and a second end coupled to a second terminal, the second bandpass filter having a second passband that does not overlap with the first passband and is higher than the first passband; and
a first band-stop filter having a first end coupled to the first terminal and a second end coupled to the second terminal and including one or more series resonators and one or more parallel resonators, the one or more series resonators being connected in series between the first terminal and the second terminal, a first end of each of the one or more parallel resonators being connected to a line between the first terminal and the second terminal, a second end of each of the one or more parallel resonators being connected to a ground, wherein antiresonant frequencies of the one or more series resonators are located within the first passband or near the first passband,
resonant frequencies of the one or more parallel resonators are located within the second passband or near the second passband,
an average value of the antiresonant frequencies of the one or more series resonators is located within the first passband, and
an average value of the resonant frequencies of the one or more parallel resonators is located within the second passband.

10. The multiplexer according to claim 9, wherein
the one or more series resonators and the one or more parallel resonators are acoustic wave resonators.

11. The multiplexer according to claim 10, wherein the first bandpass filter and the second bandpass filter include acoustic wave resonators.

12. The multiplexer according to claim 10, wherein
the first bandpass filter and the second bandpass filter are ladder-type filters in which acoustic wave resonators are connected in a ladder configuration.

13. A multiplexer comprising:
a first bandpass filter having a first end coupled to a common terminal and a second end coupled to a first terminal, the first bandpass filter having a first passband;
a second bandpass filter having a first end coupled to the common terminal and, a second end coupled to a second terminal, the second bandpass filter having a second passband that does not overlap with the first passband and is higher than the first passband;
a first band-stop filter having a first end coupled to the first terminal and a second end coupled to the second terminal, the first band-stop filter having a first stopband formed of a first attenuation pole and a second attenuation pole, the first attenuation pole being located within the first passband or near the first passband, the second attenuation pole being located within the second passband or near the second passband;
a third bandpass filter having a first end coupled to the common terminal and a second end coupled to a third terminal, the third bandpass filter having a third passband that overlaps with none of the first passband and the second passband, and is higher than the second passband;
a second band-stop filter having a first end coupled to the second terminal and a second end coupled to the third terminal, the second band-stop filter having a second stopband formed of a third attenuation pole and a fourth attenuation pole, the third attenuation pole being located within the second passband or near the second passband, the fourth attenuation pole being located in the third passband, or near the third passband; and
a third band-stop filter having a first end coupled to the third terminal and a second end coupled to the first terminal, the third band-stop filter having a third stopband formed of a fifth attenuation pole and a sixth attenuation pole, the fifth attenuation pole being located within the third passband or near the third passband, the sixth attenuation pole being located within the first passband or near the first passband.

14. The multiplexer according to claim 13, wherein the first band-stop filter includes one or more series resonators and one or more parallel resonators, the one or more series resonators being connected in series between the first terminal and the second terminal, a first end of each of the one or more parallel resonators being connected to a line between the first terminal and the second terminal, a second end of each of the one or more parallel resonators being connected to a ground.

15. The multiplexer according to claim 14, wherein
antiresonant frequencies of the one or more series resonators are located within the first passband or near the first passband, and
resonant frequencies of the one or more parallel resonators are located within the second passband or near the second passband.

16. The multiplexer according to claim 14, wherein
antiresonant frequencies of the one or more series resonators are located within the first passband or near the first passband, and
resonant frequencies of the one or more parallel resonators, are located within the second passband or near the second passband.

17. The multiplexer according to claim 16, wherein
an average value of the antiresonant frequencies of the one or more series resonators is located within the first passband, and
an average value of the resonant frequencies of the one or more parallel resonators is located within the second passband.

18. The multiplexer according to claim 16, wherein
the one or more series resonators includes a plurality of series resonators,
an antiresonant frequency of one of the series resonators is lower than the first passband, and an antiresonant frequency of another of the series resonators is higher than the first passband,
the one or more parallel resonators include a plurality of parallel resonators, and
a resonant frequency of one of the parallel resonators is lower than the second passband, and a resonant frequency of another of the parallel resonators is higher than the second passband.

19. The multiplexer according to claim 16, wherein
the one or more series resonators and the one or more parallel resonators are acoustic wave resonators.

20. The multiplexer according to claim 19, wherein the first bandpass filter and the second bandpass filter include acoustic wave resonators.

* * * * *